US012796086B2

(12) United States Patent
Bian et al.

(10) Patent No.: US 12,796,086 B2
(45) Date of Patent: Nov. 10, 2026

(54) ARRAY SUBSTRATE AND DISPLAY APPARATUS

(71) Applicants: Beijing BOE Optoelectronics Technology Co., Ltd., Beijing (CN); BOE Technology Group Co., Ltd., Beijing (CN)

(72) Inventors: Ruomei Bian, Beijing (CN); Honggui Jin, Beijing (CN); Zhilong Duan, Beijing (CN); Peipei Wang, Beijing (CN); Pingyuan Sun, Beijing (CN); Yang Liu, Beijing (CN); Yong Zhang, Beijing (CN); Jian Wang, Beijing (CN); Yue Yang, Beijing (CN)

(73) Assignees: Beijing BOE Optoelectronics Technology Co., Ltd., Beijing (CN); Beijing BOE Technology Development Co., Ltd, Beijing (CN)

( * ) Notice: Subject to any disclaimer, the term of this patent is extended or adjusted under 35 U.S.C. 154(b) by 386 days.

(21) Appl. No.: 18/699,924

(22) PCT Filed: Nov. 25, 2022

(86) PCT No.: PCT/CN2022/134227

§ 371 (c)(1),
(2) Date: Apr. 10, 2024

(87) PCT Pub. No.: WO2024/108524

PCT Pub. Date: May 30, 2024

(65) Prior Publication Data

US 2025/0241066 A1 Jul. 24, 2025

(51) Int. Cl.

| | |
|---|---|
| ***H10D 86/40*** | (2025.01) |
| ***G02F 1/1362*** | (2006.01) |
| ***H10D 86/60*** | (2025.01) |

(52) U.S. Cl.

CPC ..... *H10D 86/443* (2025.01); *G02F 1/136204* (2013.01); *G02F 1/136286* (2013.01); *H10D 86/60* (2025.01); *G02F 2201/56* (2013.01)

(58) Field of Classification Search

CPC .......... G02F 1/136204; G02F 2201/56; H10D 86/443; G09G 2330/06

See application file for complete search history.

(56) References Cited

U.S. PATENT DOCUMENTS

2008/0048934 A1 2/2008 Yamamoto et al.
2008/0106835 A1 * 5/2008 Ker .................. G02F 1/136204 361/56

(Continued)

FOREIGN PATENT DOCUMENTS

CN 107742473 A 2/2018
CN 110085118 A 8/2019

(Continued)

OTHER PUBLICATIONS

Extended European Search Report received for European Patent Application No. 22966215.0, mailed on May 28, 2025, 10 pages.

*Primary Examiner* — Alexander P Gross
(74) *Attorney, Agent, or Firm* — ArentFox Schiff LLP; Michael Fainberg

(57) ABSTRACT

Disclosed are an array substrate and a display apparatus, a plurality of gate lines are arranged in the first direction in the display area and extend to the bezel area in a second direction; the plurality of data lines are arranged in the second direction in the display area, extend to the second bezel area in the first direction and are arranged around the second display area in the second bezel area; and a plurality of anti-static structures are electrically connected with the plurality of gate lines, the plurality of anti-static structures include a plurality of first anti-static structures located in the first bezel area and a plurality of second anti-static structures (Continued)

located in the second bezel area, at least part of the first anti-static structures extend in the first direction, and at least part of the second anti-static structures extend in a winding direction of the data lines.

20 Claims, 26 Drawing Sheets

(56) References Cited

U.S. PATENT DOCUMENTS

| | | | | |
|---|---|---|---|---|
| 2019/0096978 | A1 | 3/2019 | Jung et al. | |
| 2022/0180784 | A1* | 6/2022 | Liu | G09G 3/20 |
| 2022/0343843 | A1* | 10/2022 | Du | G09G 3/006 |

FOREIGN PATENT DOCUMENTS

| | | | | | |
|---|---|---|---|---|---|
| CN | 111599847 | A | | 8/2020 | |
| CN | 111681554 | A | * | 9/2020 | H05K 9/0067 |
| CN | 111708238 | A | | 9/2020 | |
| CN | 110085118 | B | | 3/2021 | |
| CN | 113035844 | A | | 6/2021 | |
| CN | 114937420 | A | | 8/2022 | |
| CN | 115061599 | A | | 9/2022 | |
| CN | 112614871 | A | | 4/2024 | |
| KR | 10-2007-0071705 | A | | 7/2007 | |
| WO | 2022/109874 | A1 | | 6/2022 | |

* cited by examiner

ARRAY SUBSTRATE AND DISPLAY APPARATUS

CROSS-REFERENCE TO RELATED APPLICATIONS

The application is a National Stage of International Application No. PCT/CN2022/134227, filed Nov. 25, 2022, which is hereby incorporated by reference in its entirety.

TECHNICAL FIELD

The disclosure relates to the technical field of display, and particularly relates to an array substrate and a display apparatus.

BACKGROUND

With rapid development of the display technology, display panels are required not only to function as a traditional information displayer, but also to upgrade in appearance for better adapting to environmental overall structure and use requirements. As a result, special-shaped display panels emerge. A special-shaped display panel is a display panel transformed from a traditional shape into a special shape, such that characteristics of the display panel can better adapt to the overall structure and the environment. The special-shaped display panels have been successfully applied to wearable electronic devices such as watches, glasses, or smart bracelets. Common special-shaped display panels are predominantly fan-shaped, arc-shaped, circular, cylindrical, polygonal, etc.

SUMMARY

Embodiments of the disclosure provide an array substrate and a display apparatus, the specific solution is as follows.

In one aspect, an array substrate according to embodiments of the disclosure includes:

a base substrate, where the base substrate includes a display area and a bezel area surrounding the display area, where the display area includes a first display area and a second display area that are sequentially arranged in a first direction, and the second display area is a non-rectangular display area; and the bezel area includes a first bezel area surrounding the first display area and a second bezel area surrounding the second display area;

a plurality of gate lines arranged in the first direction and extending in a second direction in the first display area and the second display area, where the gate lines in the first display area extend to the first bezel area, the gate lines in the second display area extend to the second bezel area, and the second direction intersects with the first direction;

a plurality of data lines insulated from the plurality of gate lines, where the plurality of data lines are arranged in the second direction and extend in the first direction in the first display area and the second display area, and the plurality of data lines extend to the second bezel area and are arranged around the second display area in the second bezel area; and a plurality of anti-static structures electrically connected with the plurality of gate lines, where the plurality of anti-static structures include a plurality of first anti-static structures located in the first bezel area and a plurality of second anti-static structures located in the second bezel area, where at least part of the first anti-static structures extend in the first direction, and at least part of the second anti-static structures extend in a winding direction of the data lines.

In some embodiments, in the array substrate according to embodiments of the disclosure, the anti-static structures electrically connected with two adjacent gate lines are separately arranged on two sides of the display area.

In some embodiments, the array substrate according to embodiments of the disclosure further includes a plurality of first floating anti-static structures and a plurality of second floating anti-static structures. The plurality of first floating anti-static structures are electrically connected with the plurality of first anti-static structures in the first bezel area, and the plurality of first floating anti-static structures and two first anti-static structures, farthest from the second bezel area, in the first bezel area are arranged side by side in the second direction. The second floating anti-static structures are electrically connected with the plurality of second anti-static structures in the second bezel area, and the plurality of second floating anti-static structures and two second anti-static structures, farthest from the first bezel area, in the second bezel area are arranged side by side in the winding direction of the data lines.

In some embodiments, the array substrate according to embodiments of the disclosure further includes a short circuit ring. The short circuit ring is located in the first bezel area and the second bezel area; and the plurality of anti-static structures are electrically connected with the plurality of first floating anti-static structures and the plurality of second floating anti-static structures respectively by means of the short circuit ring.

In some embodiments, the array substrate according to embodiments of the disclosure further includes a common electrode line and a common electrode. The common electrode line is located in the first bezel area and the second bezel area. The common electrode extends from the first display area and the second display area to the first bezel area and the second bezel area; and the plurality of first floating anti-static structures are electrically connected with the common electrode line; and the plurality of second floating anti-static structures are electrically connected with the common electrode.

In some embodiments, the array substrate according to embodiments of the disclosure further includes a first connecting line; the first connecting line is arranged at the same layer as the plurality of gate lines. The first connecting line connects the second floating anti-static structures with the common electrode.

In some embodiments, in the array substrate according to embodiments of the disclosure, the short circuit ring and the common electrode line are both at the same layer as the plurality of data lines.

In some embodiments, in the array substrate according to the embodiment of the disclosure, the second bezel area includes a bonding area approximately extending in the second direction on one side of the second display area far away from the first display area, a non-rectangular area connecting the bonding area to the first bezel area, and a wiring area located between the bonding area and the second display area;

the array substrate further includes a second connecting line, the second connecting line is arranged at the same layer as the plurality of gate lines, the second connecting line is connected between the common electrode line and the bonding area, the second connecting line includes a widened portion, the widened portion is arranged close to a joint between the wiring area and the non-rectangular area, and the widened portion is of a grid structure.

In some embodiments, in the array substrate according to embodiments of the disclosure, at least part of the gate lines are electrically connected with the anti-static structures after bending the first bezel area and the second bezel area.

In some embodiments, the array substrate according to embodiments of the disclosure further includes a plurality of gateway lines, the plurality of gateway lines are electrically connected with the plurality of anti-static structures at one side of the plurality of anti-static structures far away from the first display area and the second display area;

the plurality of gateway lines include a plurality of first gateway lines and a plurality of second gateway lines, the plurality of first gateway lines are arranged at the same layer as the plurality of gate lines. The plurality of second gateway lines are arranged at the same layer as the plurality of data lines.

In some embodiments, in the array substrate according to embodiments of the disclosure, the anti-static structure includes a first transistor and a second transistor. A gate electrode of the first transistor is electrically connected with the gate line and the gateway line separately. A first electrode of the first transistor is electrically connected with the gate electrode of the first transistor. A second electrode of the first transistor is integrated with a first electrode of the second transistor. A second electrode of the second transistor is integrated with the first electrode of the first transistor, and a gate electrode of the second transistor is electrically connected with the first electrode of the second transistor and the short circuit ring.

In some embodiments, the array substrate according to embodiments of the disclosure further includes a plurality of first adapter electrodes and a plurality of second adapter electrodes; the plurality of first adapter electrodes and the plurality of second adapter electrodes are arranged at a same layer, and are on a side of a layer where the plurality of gate lines are located and a layer where the plurality of data lines are located facing away from the base substrate; and the gate electrode of the first transistor is electrically connected with the gate line and the gateway line separately by means of the first adapter electrode; the gate electrode of the second transistor is electrically connected with the first electrode of the second transistor and the short circuit ring separately by means of the second adapter electrode.

In some embodiments, in the array substrate according to embodiments of the disclosure, the second bezel area includes a bonding area approximately extending in the second direction on one side of the second display area far away from the first display area, a non-rectangular area connecting the bonding area to the first bezel area, and a wiring area located between the bonding area and the second display area; and the gateway line includes a first gateway line segment located in the non-rectangular area, a second gateway line segment located in the wiring area, and a third gateway line segment connecting the first gateway line segment to the second gateway line segment; and a sum of a line width of the first gateway line segment and a line distance between adjacent first gateway line segments at the same layer is a first distance; a sum of a line width of the second gateway line segment and a line distance between adjacent second gateway line segments at the same layer is a second distance; and a sum of a line width of the third gateway line segment and a line distance between adjacent third gateway line segments at the same layer is a third distance; and a ratio of the first distance to the second distance is greater than 1 and smaller than or equal to 1.5.

In some embodiments, the array substrate according to embodiments of the disclosure further includes a ground line. The ground line is arranged at the same layer as the plurality of gate lines. The ground line is located on one side of the plurality of gateway lines far away from the plurality of anti-static structures.

In some embodiments, the array substrate according to the embodiment of the disclosure further includes a plurality of floating blocks. The plurality of floating blocks are arranged at the same layer as the plurality of gate lines, and the plurality of floating blocks are approximately evenly distributed between the ground line and the plurality of gateway lines.

In some embodiments, the array substrate according to the embodiment of the disclosure further includes a plurality of third connecting lines; the plurality of third connecting lines are located at the same layer as the plurality of gate lines.

the second bezel area includes the bonding area approximately extending in the second direction on one side of the second display area far away from the first display area, and the non-rectangular area connecting the bonding area to the first bezel area; and the plurality of data lines include first data lines and second data lines that are alternately arranged, the first data lines cross from the first display area and the second display area over the non-rectangular area and extend to the bonding area, the second data lines cross from the first display area and the second display area over the non-rectangular area and are connected with the bonding area through the third connecting lines.

In some embodiments, in the array substrate according to embodiments of the disclosure, an orthogonal projection of the third connecting line on the base substrate at least partially overlaps with an orthogonal projection of the adjacent first data line on the base substrate.

In some embodiments, the array substrate according to embodiments of the disclosure further includes a plurality of third adapter electrodes, a first insulation layer, and a second insulation layer; a layer where the plurality of third adapter electrodes are located is on a side of a layer where the plurality of gate lines are located and a layer where the plurality of data lines are located facing away from the base substrate; the first insulation layer is located between the layer where the plurality of gate lines are located and the layer where the plurality of data lines are located; the second insulation layer is located between the layer where the plurality of data lines are located and the layer where the plurality of third adapter electrodes are located; and the third adapter electrode is electrically connected with the third connecting line by means of at least one first via hole penetrating the first insulation layer and the second insulation layer. The third adapter electrode is electrically connected with the second data line by means of at least one second via hole penetrating the second insulation layer. The at least one first via hole and the at least one second via hole corresponding to the same third adapter electrode are arranged in the first direction.

In some embodiments, the array substrate according to embodiments of the disclosure further includes a plurality of fourth connecting lines and a plurality of fifth connecting lines; the plurality of fourth connecting lines are located at the same layer as the plurality of gate lines; the plurality of fifth connecting lines are located at the same layer as the plurality of data lines; and the second bezel area further includes the wiring area located between the bonding area and the second display area; and the plurality of data lines include third data lines and fourth data lines that are alternately arranged; the third data lines extend from the first display area and the second display area to the wiring area and are connected with the bonding area through the fourth connecting lines; the fourth data lines extend from the first display area and the second display area to the wiring area and are connected with the bonding area through the fifth connecting lines.

In some embodiments, in the array substrate according to embodiments of the disclosure, an orthogonal projection of the fourth connecting line on the base substrate at least partially overlaps with an orthogonal projection of the fifth connecting line on the base substrate.

In some embodiments, the array substrate according to embodiments of the disclosure further includes a plurality of fourth adapter electrodes, a plurality of fifth adapter electrodes, the first insulation layer, and the second insulation layer; the plurality of fourth adapter electrodes and the plurality of fifth adapter electrodes are arranged at a same layer, and are on a side of a layer where the plurality of gate lines are located and a layer where the plurality of data lines are located facing away from the base substrate; the first insulation layer is located between the layer where the plurality of gate lines are located and the layer where the plurality of data lines are located; the second insulation layer is located between the layer where the plurality of data lines are located and a layer where the plurality of fourth adapter electrodes are located;

the fourth adapter electrode is electrically connected with the fourth connecting line by means of at least one third via hole penetrating the first insulation layer and the second insulation layer, the fourth adapter electrode is electrically connected with the third data line by means of at least one fourth via hole penetrating the second insulation layer, the at least one third via hole and the at least one fourth via hole corresponding to the same fourth adapter electrode are separately provided in the second direction; and the fifth adapter electrode is electrically connected with the fifth connecting line by means of at least one fifth via hole penetrating the second insulation layer; the fifth adapter electrode is electrically connected with the fourth data line by means of at least one sixth via hole penetrating the second insulation layer; the at least one fifth via hole and the at least one sixth via hole corresponding to the same fifth adapter electrode are separately arranged in the second direction.

In some embodiments, in the array substrate according to embodiments of the disclosure, the first data line includes a first data line segment located in the non-rectangular area and a second data line segment located in the wiring area; a sum of a line width of the first data line segment and a line distance between adjacent first data line segments is a fourth distance; a sum of a line width of the second data line segment and a line distance between adjacent second data line segments is a fifth distance; a ratio of the fourth distance to the fifth distance is greater than 1 and smaller than or equal to 1.5.

In some embodiments, in the array substrate according to embodiments of the disclosure, the second anti-static structure extends directionally and has an acute angle with the first direction; or, the second anti-static structure extends along an arc having a radian of 110°-180°.

In some embodiments, in the array substrate according to embodiments of the disclosure, the first display area includes a first sub display area arranged in contact with the second display area and a second sub display area on one side of the first sub display area far away from the second display area;

the first bezel area includes a first sub bezel area arranged side by side with the first sub display area in the second direction and a second sub bezel area arranged side by side with the second sub display area in the second direction, and the second sub bezel area and the second sub display area have a stepped boundary line; and the first anti-static structures in the first sub bezel area are arranged side by side in the first direction, and the first anti-static structures in the second sub bezel area are arranged at steps of the stepped boundary line.

In another aspect, embodiments of the disclosure further provide a display apparatus. The display apparatus includes the array substrate according to embodiments of the disclosure and a driver chip. The driver chip is electrically connected with a plurality of gate lines and a plurality of data lines.

Figure 10:
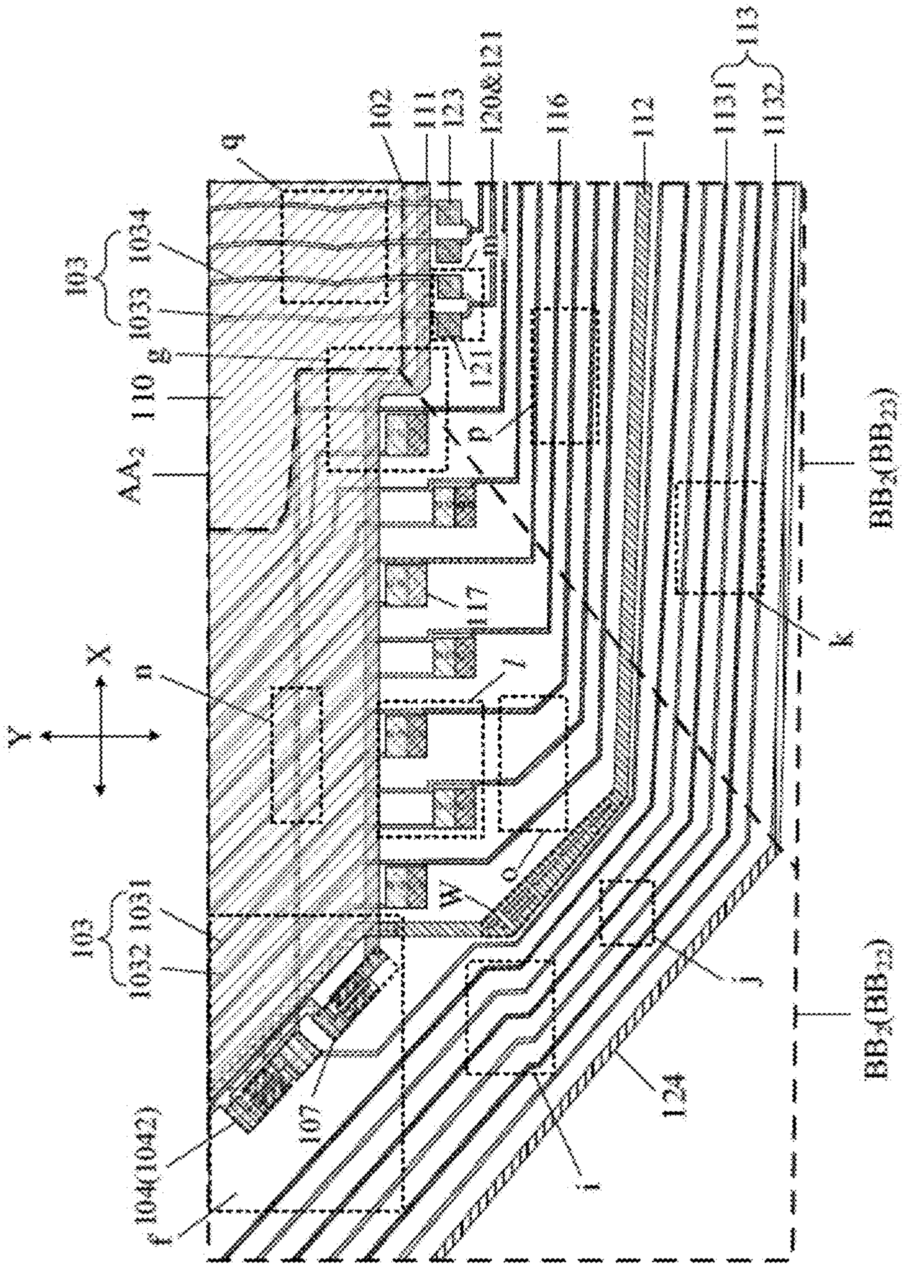
FIG. 10 is an enlarged schematic structural diagram of area e in FIG. 2.

FIG. **15*a* is an enlarged schematic structural diagram of area i in FIG. 10**.

FIG. **15*b* is another enlarged schematic structural diagram of area i in FIG. 10**.

FIG. **16*a* is an enlarged schematic structural diagram of area j in FIG. 10**.

FIG. **16*b* is another enlarged schematic structural diagram of area j in FIG. 10**.

Figure 17A:
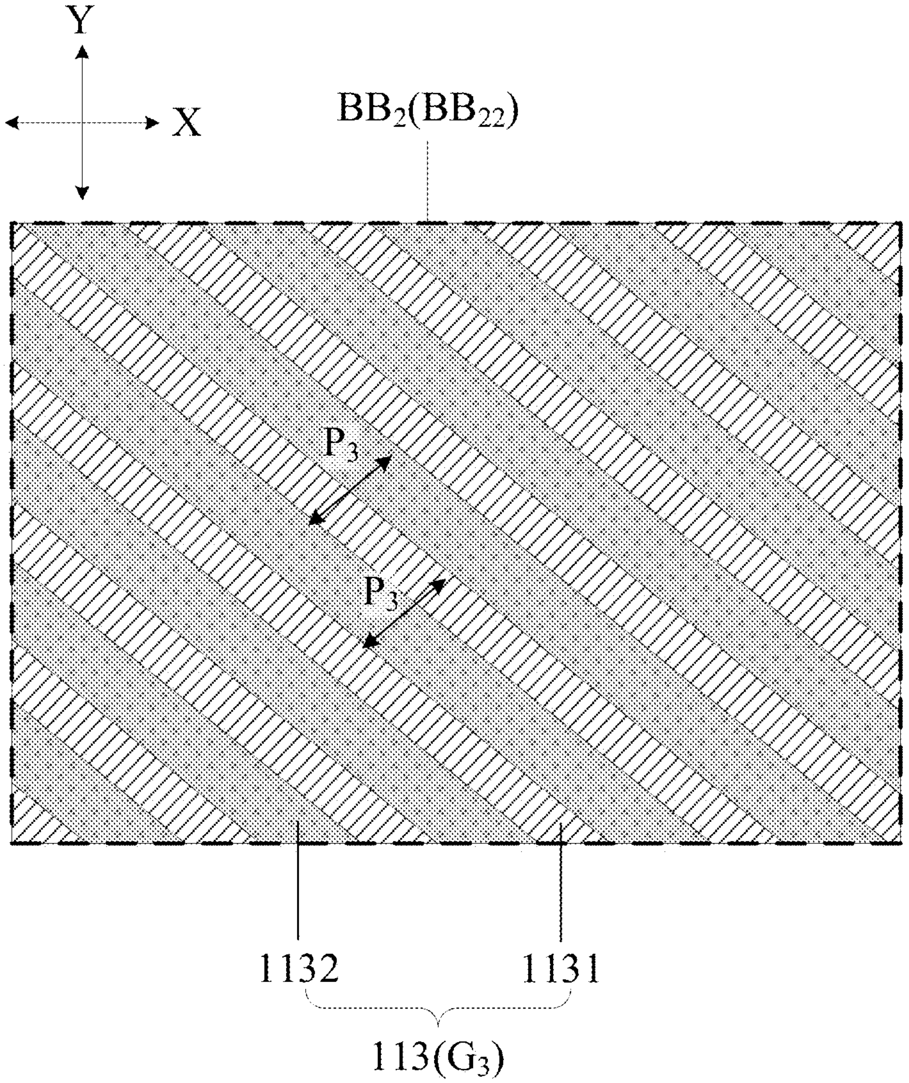

FIG. 17*a* is an enlarged schematic structural diagram of area k in FIG. 10.

Figure 17B:
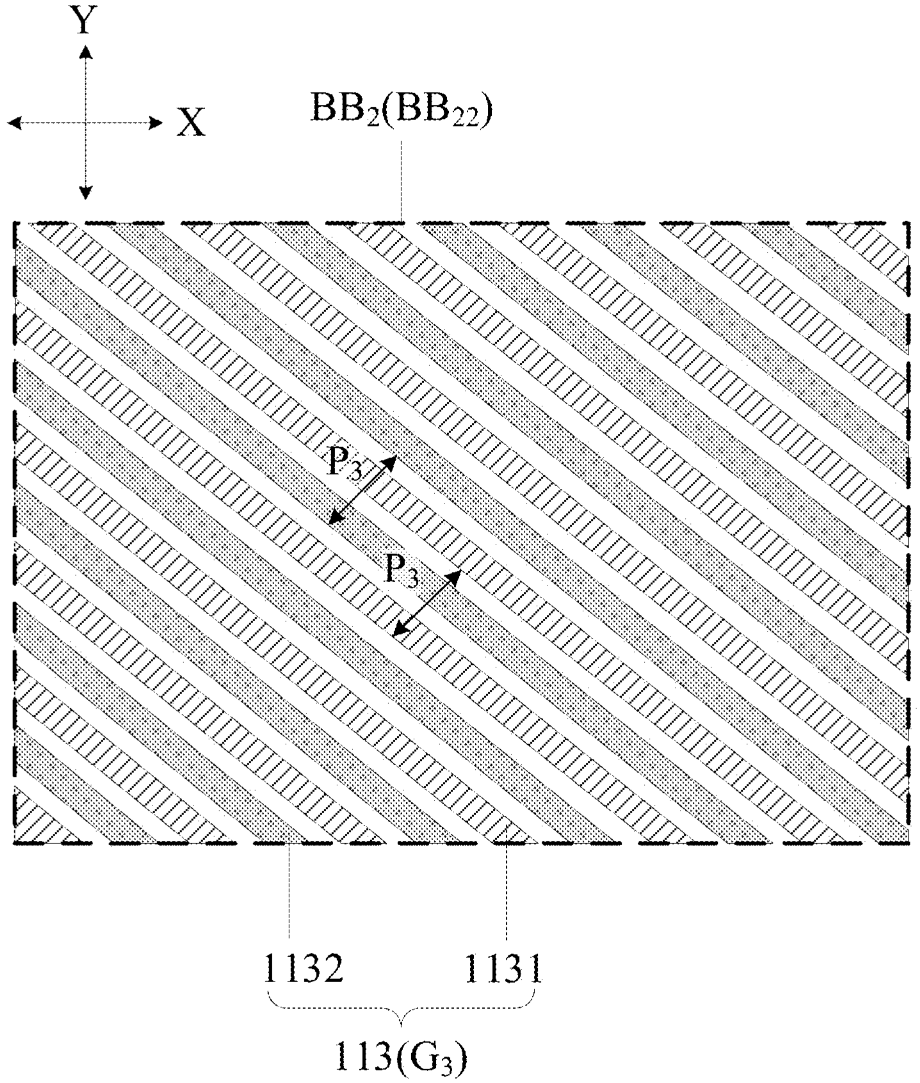

FIG. 17*b* is another enlarged schematic structural diagram of area k in FIG. 10.

Figure 18:
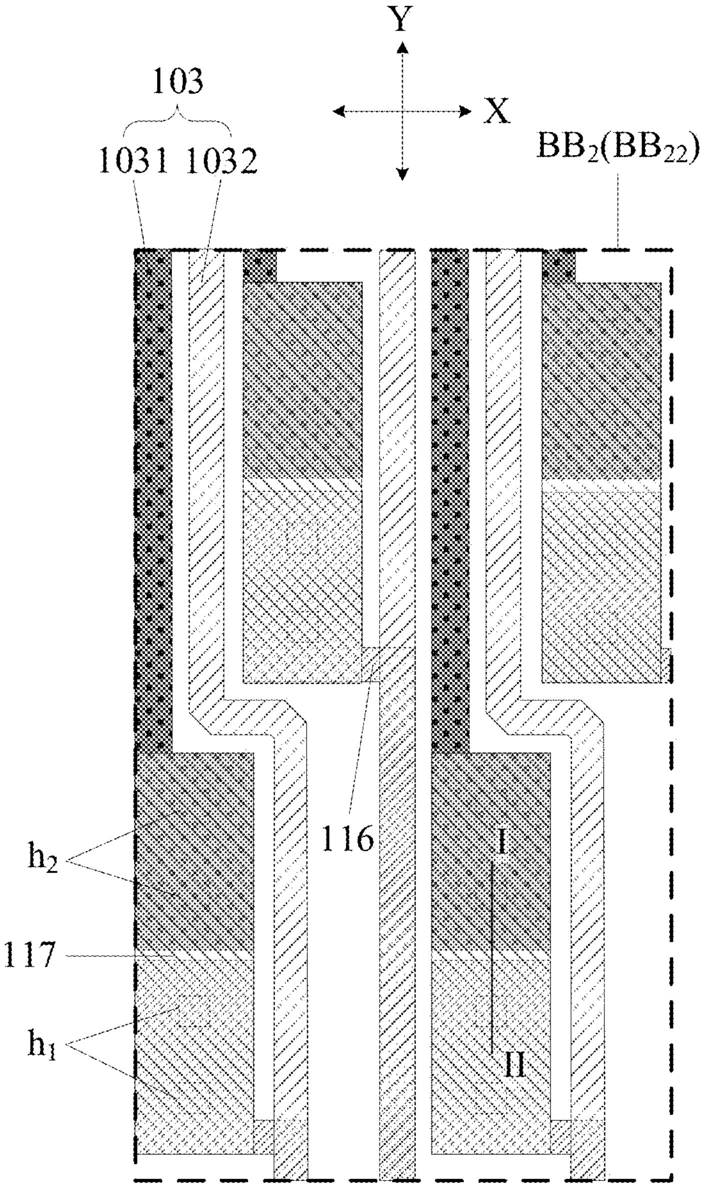

FIG. 18 is an enlarged schematic structural diagram of area/in FIG. 10.

Figure 19:
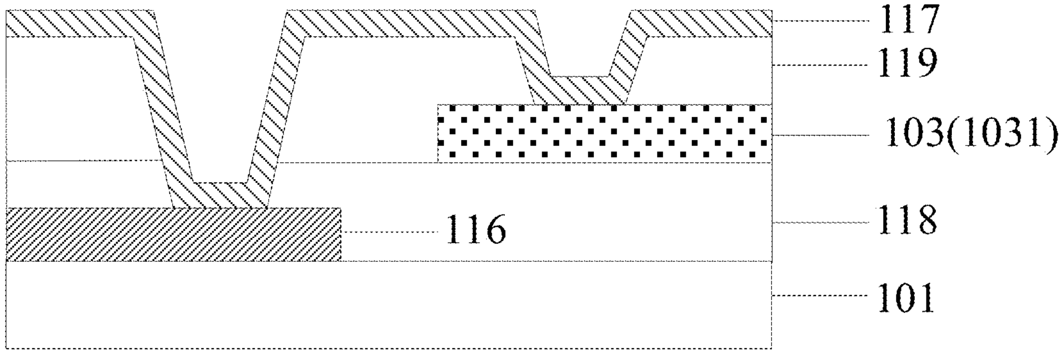

FIG. 19 is a cutaway view along line I-II in FIG. 18.

Figure 20:
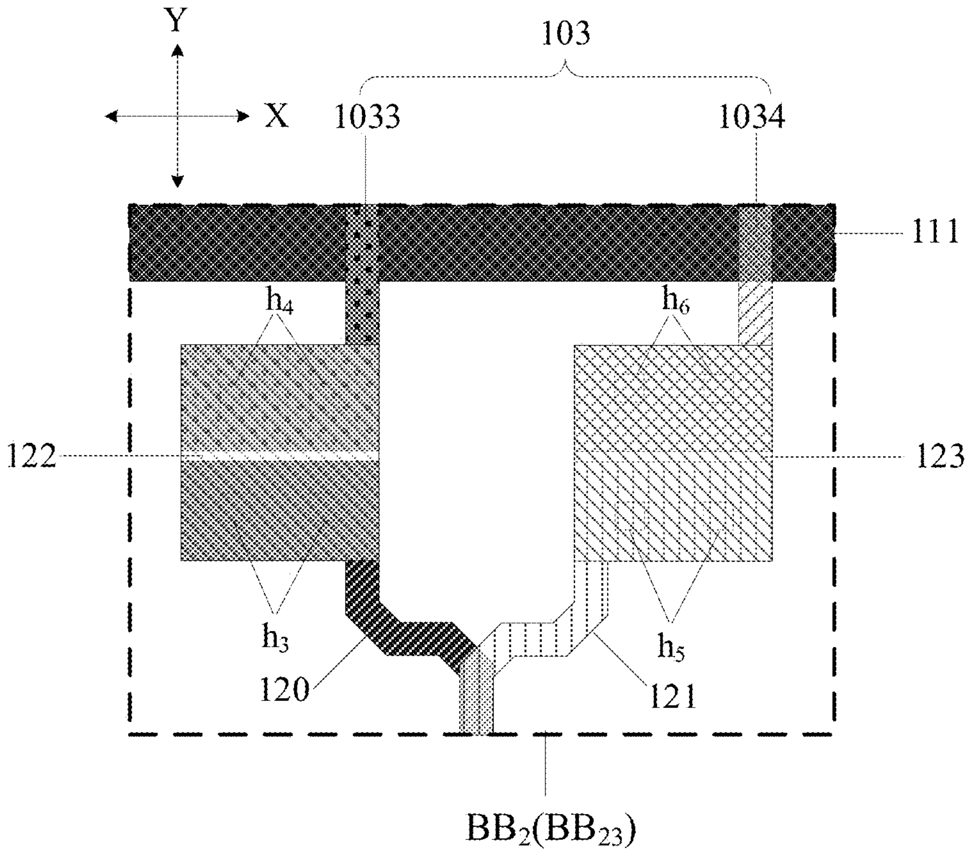

FIG. 20 is an enlarged schematic structural diagram of area m in FIG. 10.

Figure 21:
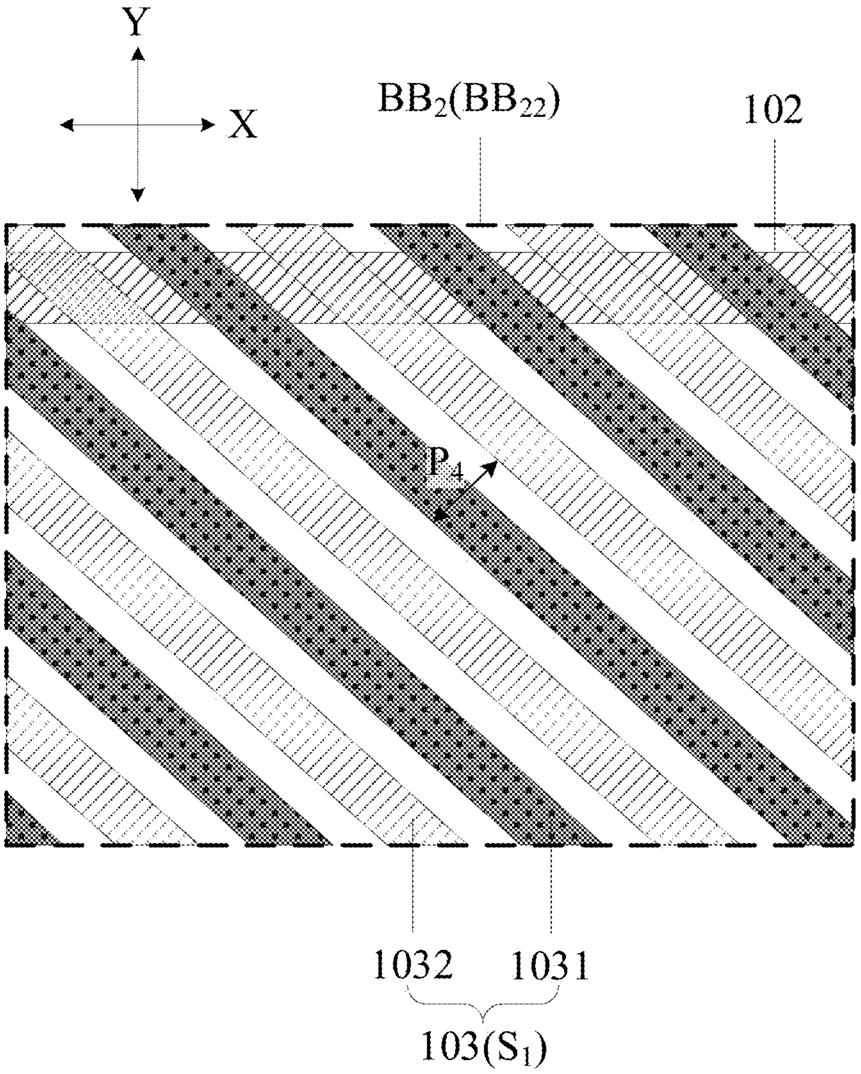

FIG. 21 is an enlarged schematic structural diagram of area n in FIG. 10.

Figure 22:
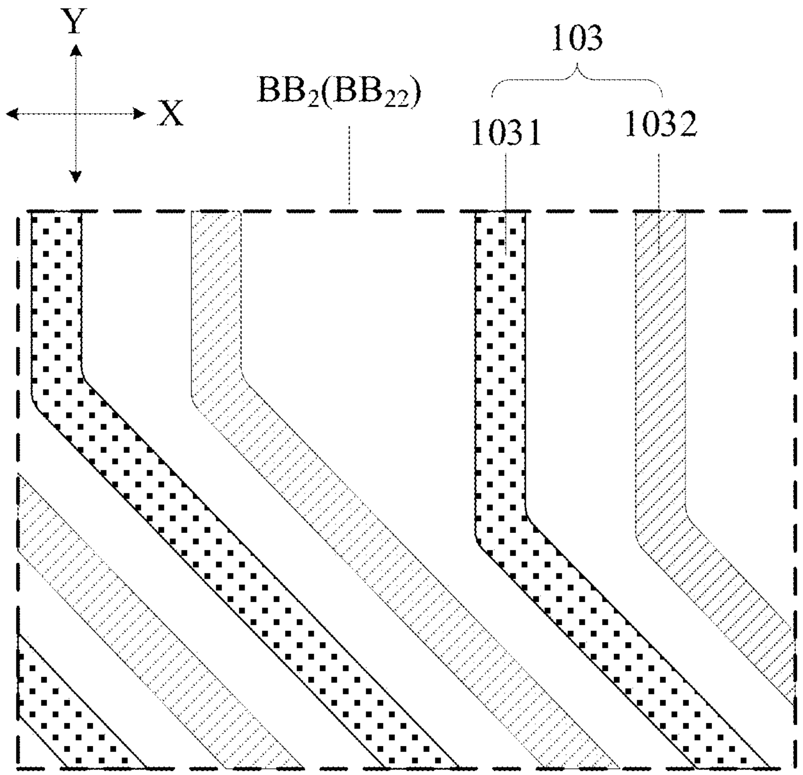

FIG. 22 is an enlarged schematic structural diagram of area o in FIG. 10.

Figure 23:
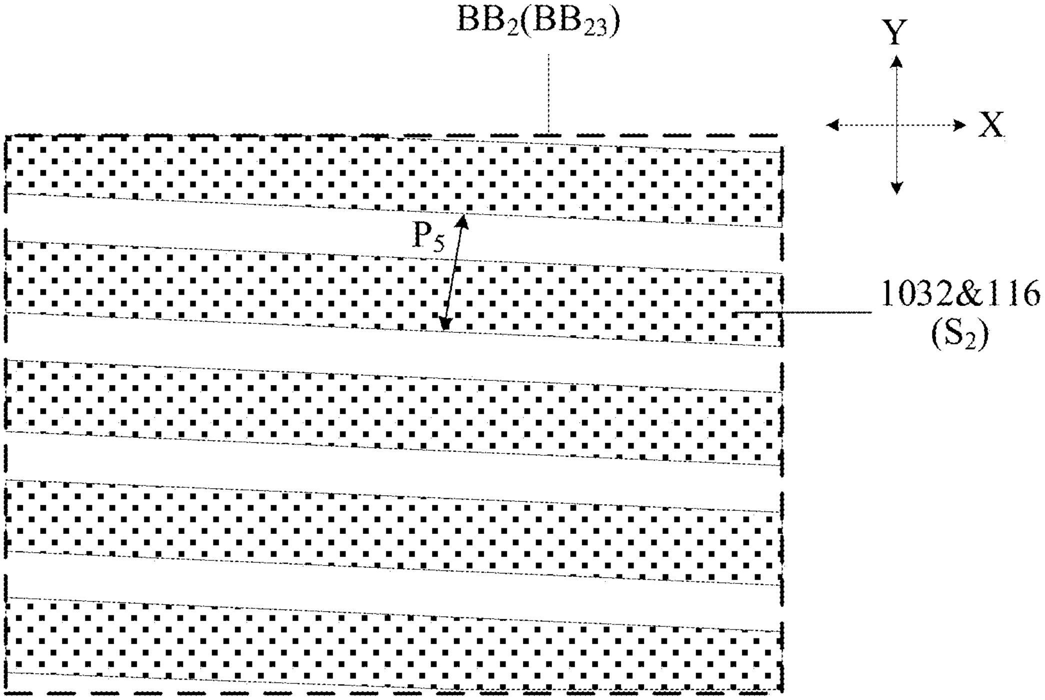

FIG. 23 is an enlarged schematic structural diagram of area p in FIG. 10.

Figure 24:
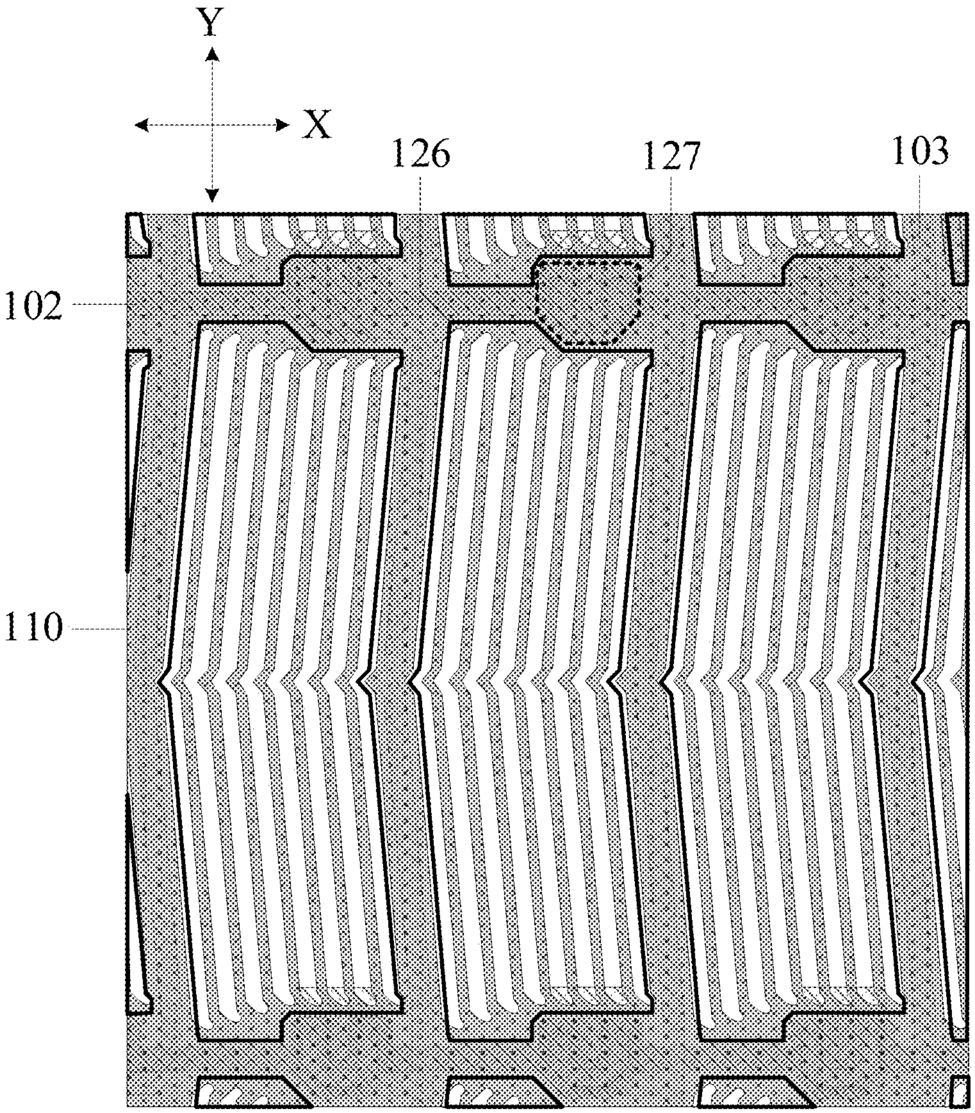

FIG. 24 is an enlarged schematic structural diagram of area q in FIG. 10.

Figure 25:
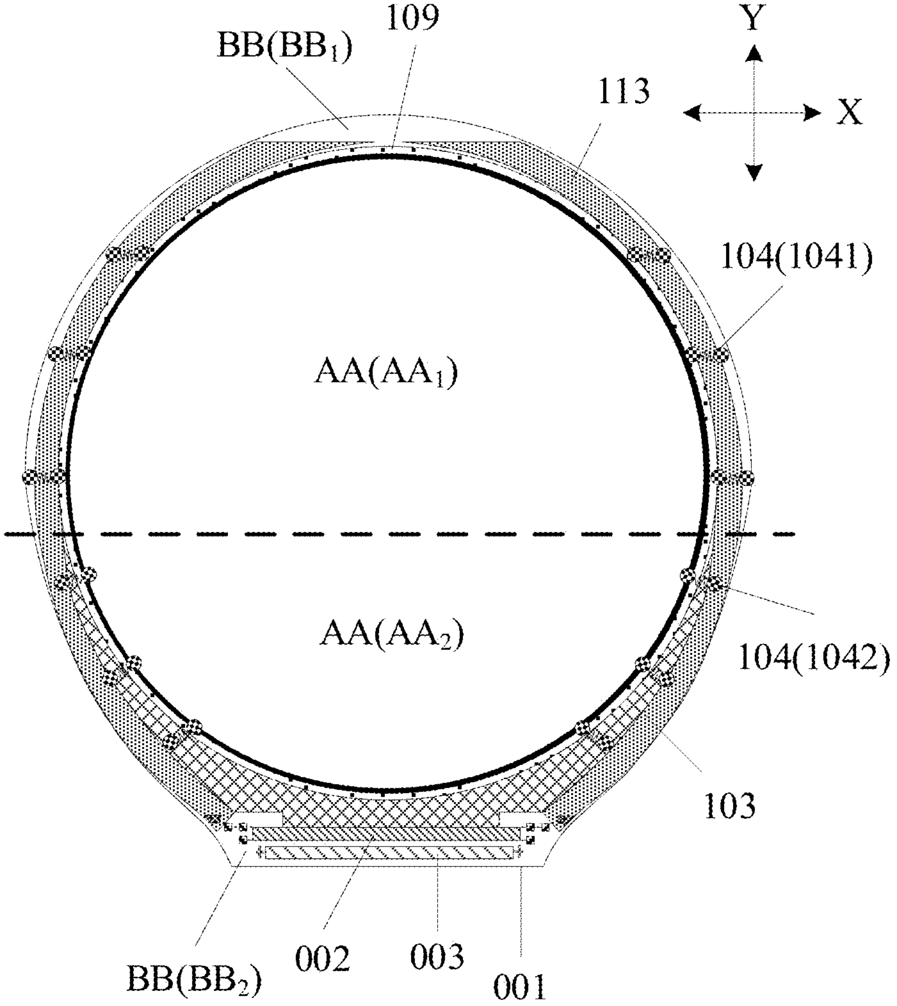

FIG. 25 is a schematic diagram of a display apparatus according to an embodiment of the disclosure.

DETAILED DESCRIPTION

In order to make the purpose, technical solutions and advantages of embodiments of the present disclosure more clear, the technical solutions of the embodiments of the present disclosure will be clearly and completely described below in conjunction with the drawings of embodiments of the present disclosure. It should be noted that the sizes and shapes of the figures in the drawings do not reflect true proportions and are only intended to illustrate the present disclosure. And, the same or similar reference numbers throughout represent the same or similar elements or elements with the same or similar functions. In order to keep the following description of embodiments of the present disclosure clear and concise, the present disclosure omits detailed descriptions of well-known functions and components.

Unless otherwise defined, technical or scientific terms used herein shall have their ordinary meaning understood by a person of ordinary skill in the art to which the disclosure belongs. "First", "second" and similar words used in the description and the claims of the disclosure do not indicate any order, quantity or importance, but are only used to distinguish different components. Words such as "include" or "comprise" mean that the elements or objects appearing before the word include the elements or objects listed after the word and their equivalents, without excluding other elements or objects. The words "connection", "connecting", etc. are not limited to physical or mechanical connection, but can include electrical connection whether direct or indirect. Words such as "inside", "outside", "up", "down" are only used to express relative positional relationships. When the absolute position of the described object is changed, the relative positional relationship may also be changed accordingly.

In the following description, when an element or a layer is described as being "on another element or layer" or "connected with another element or layer", the element or layer may be directly on another element or layer or directly connected with another element or layer, or there may be an intermediate element or an intermediate layer. When an element or a layer is described as being "arranged on another element or layer", the element or layer may be directly on another element or layer or directly connected with another element or layer, or there may be an intermediate element or an intermediate layer. However, when an element or a layer is described as being "directly on another element or layer" or "directly connected with another element or layer", there is no intermediate element or intermediate layer. Word "and/or" indicates any and all combinations of one or more associated listed items.

A display industry develops rapidly and tends to be diversified. With the rise of various display products, a position of liquid crystal display (LCD) products is impacted. In response to the change, a liquid crystal display industry constantly challenges a technological limit. Small-sized products generally focus on narrow-bezel special-shaped structures, which challenge designers.

Drive methods for gate lines of liquid crystal display products are divided into two solutions: one solution is to drive the gate lines through a gate driver on array (GOA) including a plurality of cascaded shift registers, and specifically to provide a sequence signal output by a driver chip (IC) for each row of gate lines step by step through the gate driver on array; and the other solution is to drive the gate lines through gateway lines, where sequence signals output by the driver chip are directly provided for each row of gate lines through different gateway lines.

The gateway line drive solution is different from the gate driver on array solution in that a structure size of each stage of shift register in the gate driver on array solution is the same, while a space occupied by gateway line wiring in the gateway line drive solution is increasing with decrease of a distance from the driver chip. Moreover, in a rounded corner (R angle) area near the distance of the driver chip in a special-shaped display product, a wiring space required by a data line is also increasingly enlarged as the date line is closer to the driver chip. Therefore, a fanout wire in the rounded corner area, closer to the driver chip, of the special-shaped display product using the gateway line drive solution occupies a large space, which is not conducive to implementation of a narrow bezel.

To solve the technical problems existing in the related art, embodiments of the disclosure provide an array substrate. As shown in FIGS. 1 to 6, the array substrate includes:

a base substrate 101, where the base substrate 101 includes a display area AA and a bezel area BB surrounding the display area AA, where the display area AA includes a first display area $AA_1$ and a second display area $AA_2$ that are sequentially arranged in a first direction Y, and the second display area $AA_2$ is a non-rectangular display area; the bezel area BB includes a first bezel area $BB_1$ surrounding the first display area $AA_1$ and a second bezel area BB2 surrounding the second display area $AA_2$; and "surrounding" in the disclosure may be understood as fully or partially surrounding, which is not specifically limited herein;

a plurality of gate lines 102 arranged in the first direction Y and extending in a second direction X in the first display area $AA_1$ and the second display area $AA_2$, where the gate lines 102 in the first display area $AA_1$ extend to the first bezel area $BB_1$, the gate lines 102 in the second display area $AA_2$ extend to the second bezel area BB2, and the second direction X intersects with the first direction Y;

a plurality of data lines 103 insulated from the plurality of gate lines 102, where the plurality of data lines 103 are arranged in the second direction X and extend in the first direction Y in the first display area $AA_1$ and the second display area $AA_2$, and the plurality of data lines 103 extend to the second bezel area $BB_2$ and are arranged around the second display area $AA_2$ in the second bezel area $BB_2$; and a plurality of anti-static structures 104 electrically connected with the plurality of gate lines 102, where the plurality of anti-static structures 104 include a plurality of first anti-static structures 1041 located in the first bezel area $BB_1$ and a plurality of second anti-static structures 1042 located in the second bezel area BB2, where at least part of the first anti-static structures 1041 extend in the first direction Y, and at least part of the second anti-static structures 1042 extend in a winding direction of the data lines 103.

In the array substrate according to embodiments of the disclosure, the plurality of data lines 103 extend to the second bezel area $BB_2$ and are arranged around the second display area $AA_2$ in the second bezel area $BB_2$, such that it is more difficult to narrow the second bezel area $BB_2$ compared with the first bezel area $BB_1$. At least part of the second anti-static structures 1042 in the second bezel area BB2 extend in the winding direction of the data lines 103, such that the second anti-static structures 1042 can be ensured to occupy small spaces, and further the second bezel area $BB_2$ can be reduced, which is conducive to implementation of narrow bezel design. Meanwhile, because a number of wires in the first bezel area $BB_1$ is small, the first bezel area $BB_1$ has an enough space for laying of the first anti-static structures 1041. Based on this, at least part of the first anti-static structures 1041 in the first bezel area $BB_1$ may extend in the first direction Y. The condition that the first anti-static structures 1041 extend directionally in the first direction Y can complete design and manufacture of the first anti-static structures 1041 more advantageously.

Figure 7:
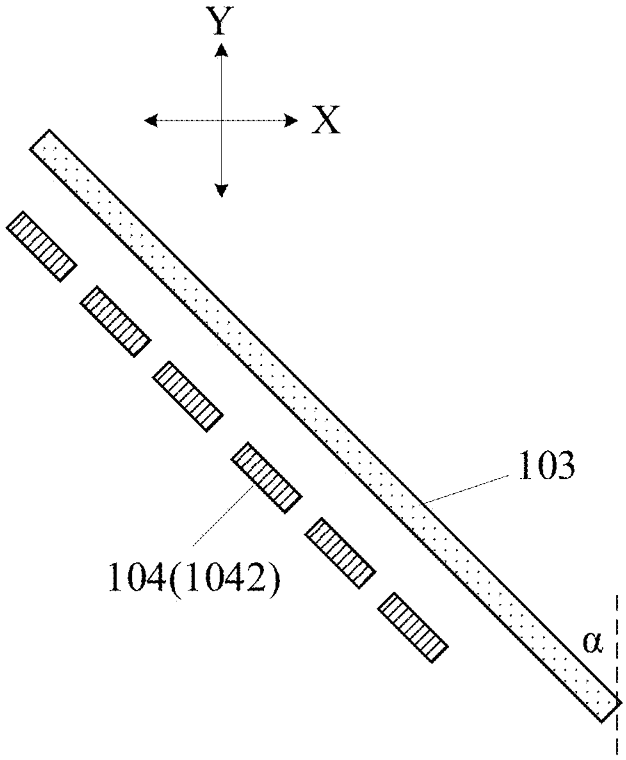
FIG. 7 is a schematic arrangement diagram of second anti-static structures according to an embodiment of the disclosure.
Figure 8:
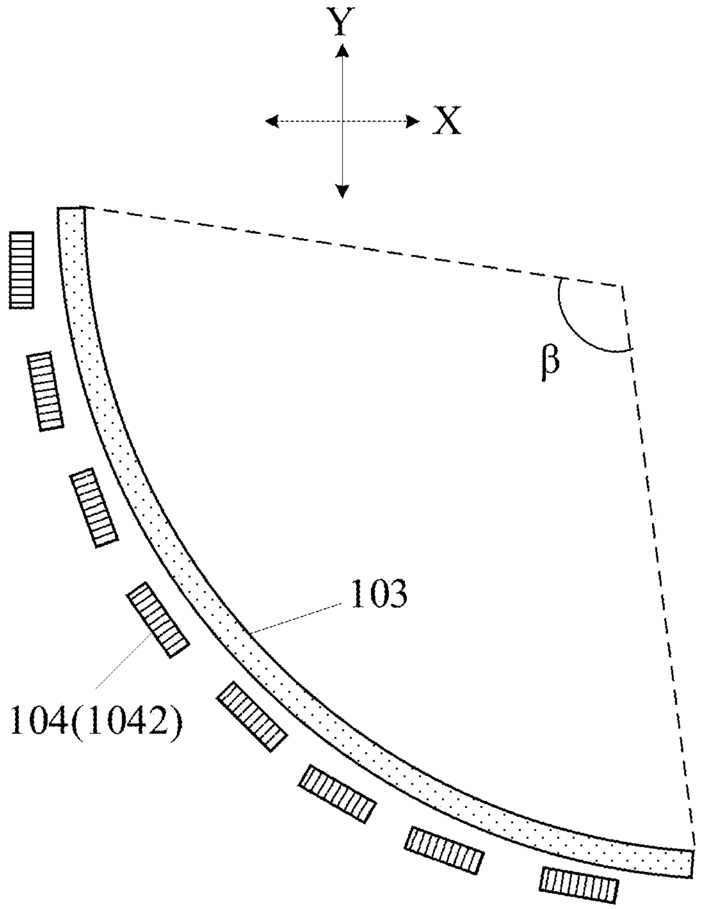
FIG. 8 is another schematic arrangement diagram of second anti-static structures according to an embodiment of the disclosure.

In some embodiments, in the array substrate according to embodiments of the disclosure, an extending direction of the second anti-static structures 1042 may be approximately parallel (for example, within an included angle of 5°) or parallel to the winding direction of the data lines 103. For example, as shown in FIG. 7, the winding direction of the data lines 103 has an acute angle $\alpha$ with the first direction Y. Accordingly, the second anti-static structure 1042 extends directionally and has an acute angle $\alpha$ with the first direction Y. Alternatively, as shown in FIG. 8, the winding direction of the data lines 103 is an arc extending direction of 110°-180°. Accordingly, the second anti-static structure 1042 extends along an arc having a radian $\beta$ of 110°-180°.

Figure 1:
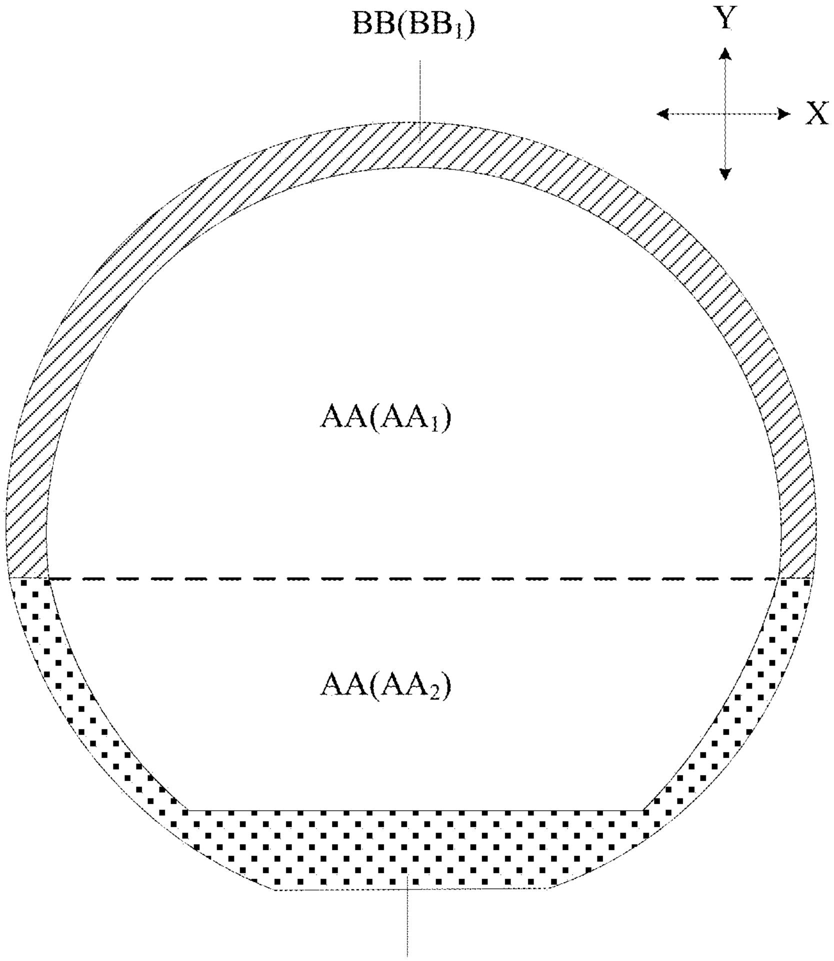
FIG. 1 is a schematic diagram of an array substrate according to an embodiment of the disclosure.
Figure 2:
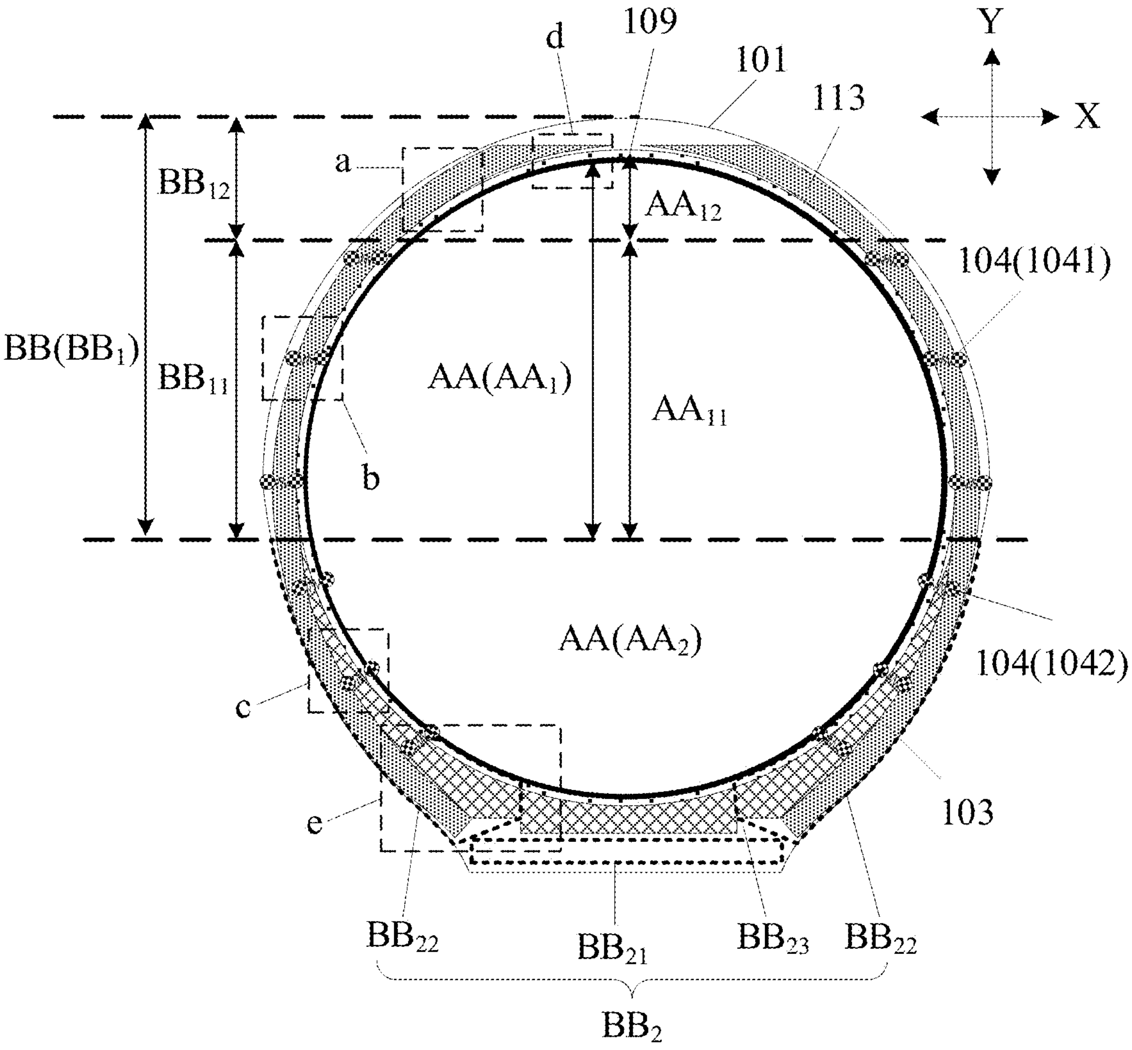
FIG. 2 is another schematic diagram of an array substrate according to an embodiment of the disclosure.
Figure 3:
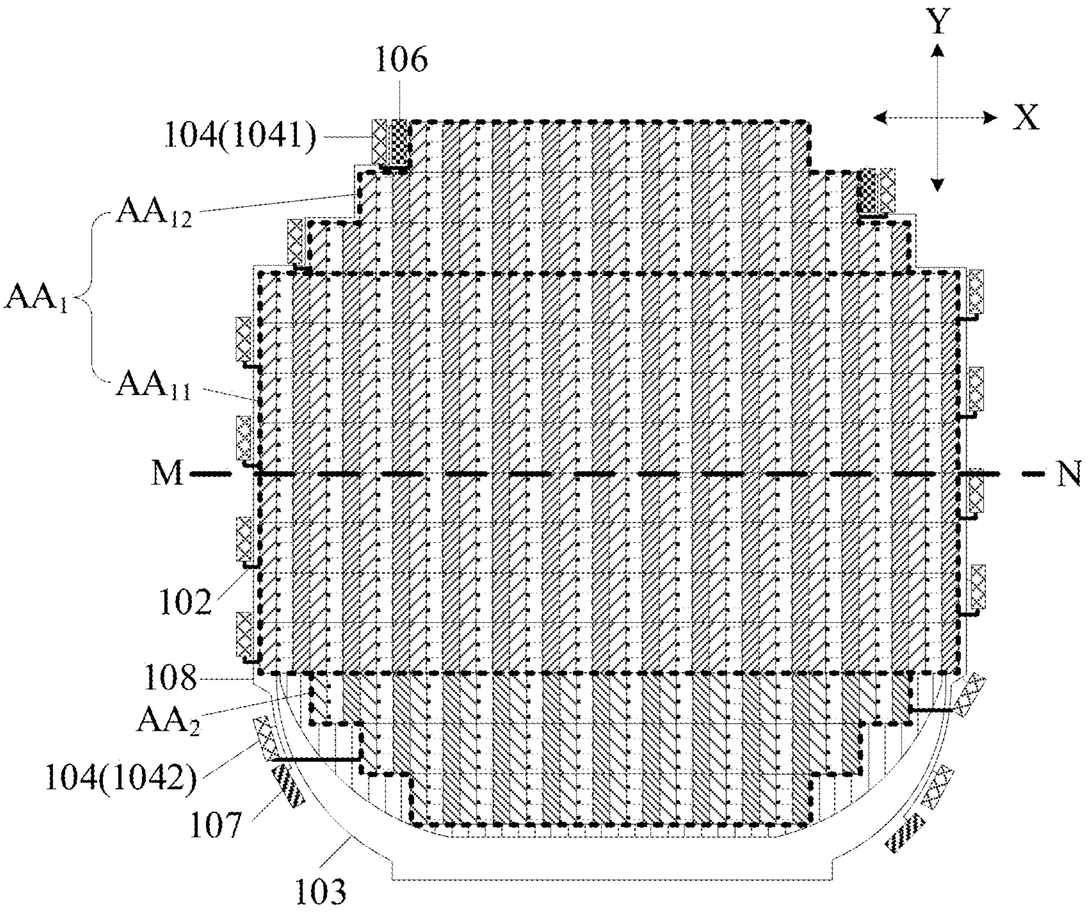
FIG. 3 is yet another schematic diagram of an array substrate according to an embodiment of the disclosure.
Figure 4:
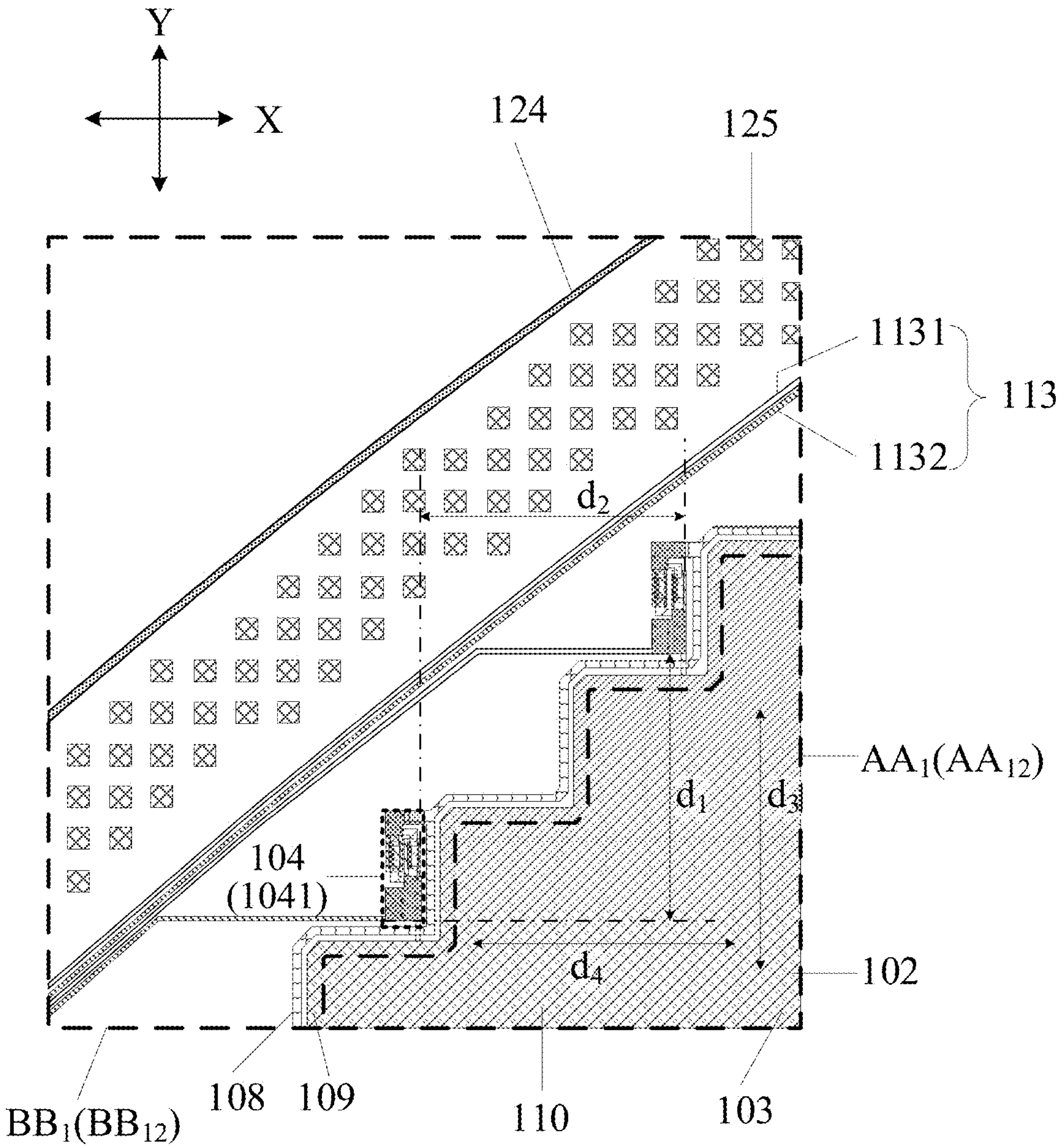
FIG. 4 is an enlarged schematic structural diagram of area a in FIG. 2.
Figure 5:
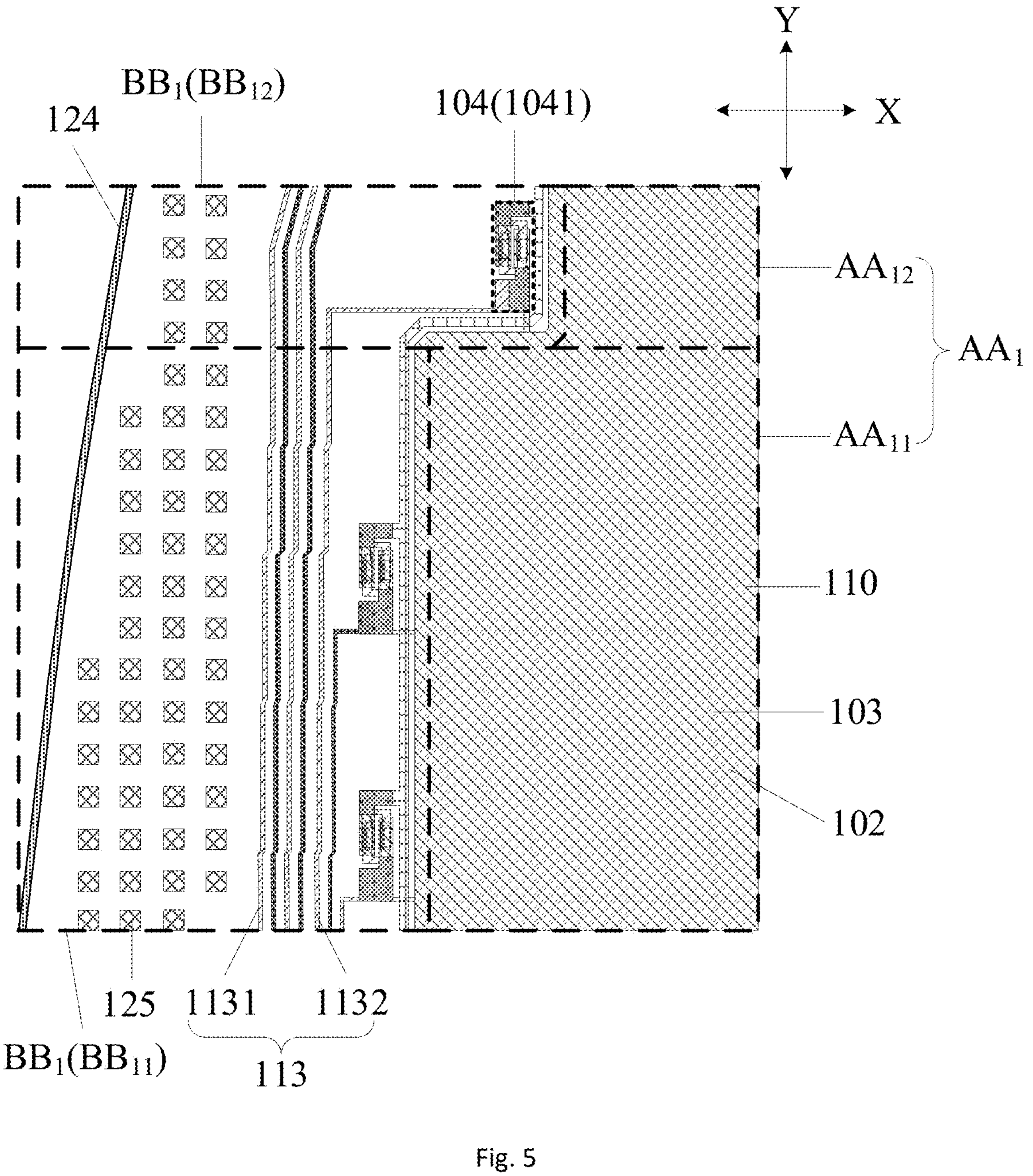
FIG. 5 is an enlarged schematic structural diagram of area b in FIG. 2.

In some embodiments, in the array substrate according to embodiments of the disclosure, as shown in FIGS. 1 to 3, the first display area $AA_1$ includes a first sub display area $AA_{11}$ arranged in contact with the second display area $AA_2$ and a second sub display area $AA_{12}$ located on one side of the first sub display area $AA_{12}$ away from the second display area $AA_2$. The second sub display area $AA_{12}$ is a non-rectangular display area that is symmetrical to the second display area $AA_2$ with respect to a symmetry axis MN extending in the second direction X in the display area AA. In some embodiments, in a direction away from the first sub display area $AA_{11}$, a width of the second sub display area $AA_{12}$ gradually decreases in the second direction X. The first bezel area $BB_1$ includes a first sub bezel area $BB_{11}$ arranged side by side with the first sub display area $AA_{11}$ in the second direction X and a second sub bezel area $BB_{12}$ arranged side by side with the second sub display area $AA_{12}$ in the second direction X. The second sub bezel area $BB_{12}$ and the second sub display area $AA_{12}$ have a stepped boundary line. With reference to FIGS. 3-5, in order to reduce widths of the first sub bezel area $BB_{11}$ and the second sub bezel area $BB_{12}$, the first anti-static structures 1041 in the first sub bezel area $BB_{11}$ may be arranged side by side in the first direction Y, and the first anti-static structures 1041 in the second sub bezel area $BB_{12}$ may be arranged at the steps of the stepped boundary line.

Further, with reference to FIG. 4, in the second sub bezel area $BB_{12}$ on one side of the second sub display area $AA_{12}$, distances between two adjacent first anti-static structures 1041 in the first direction Y and the second direction X are $d_1$ and $d_2$. In some embodiments, the distance $d_1$ between the two adjacent first anti-static structures 1041 in the first direction Y may be approximately equal to (that is, "approximately equal" can be understood as completely equal, or within a reasonable range of error caused by factors such as production and measurement) a sum $d_3$ of lengths of two pixels in the first direction Y (which may be equivalent to a sum of lengths of two pixel electrodes in the first direction Y). The distance $d_2$ between the two adjacent first anti-static structures 1041 in the second direction X may be approximately equal to (that is, "approximately equal" can be understood as completely equal, or within a reasonable range of error caused by factors such as production and measurement) a sum $d_3$ of widths of two pixels in the second direction X (which may be equivalent to a sum of the widths of 6 pixel electrodes in the second direction X under the condition that a single pixel includes three sub-pixels).

Figure 6:
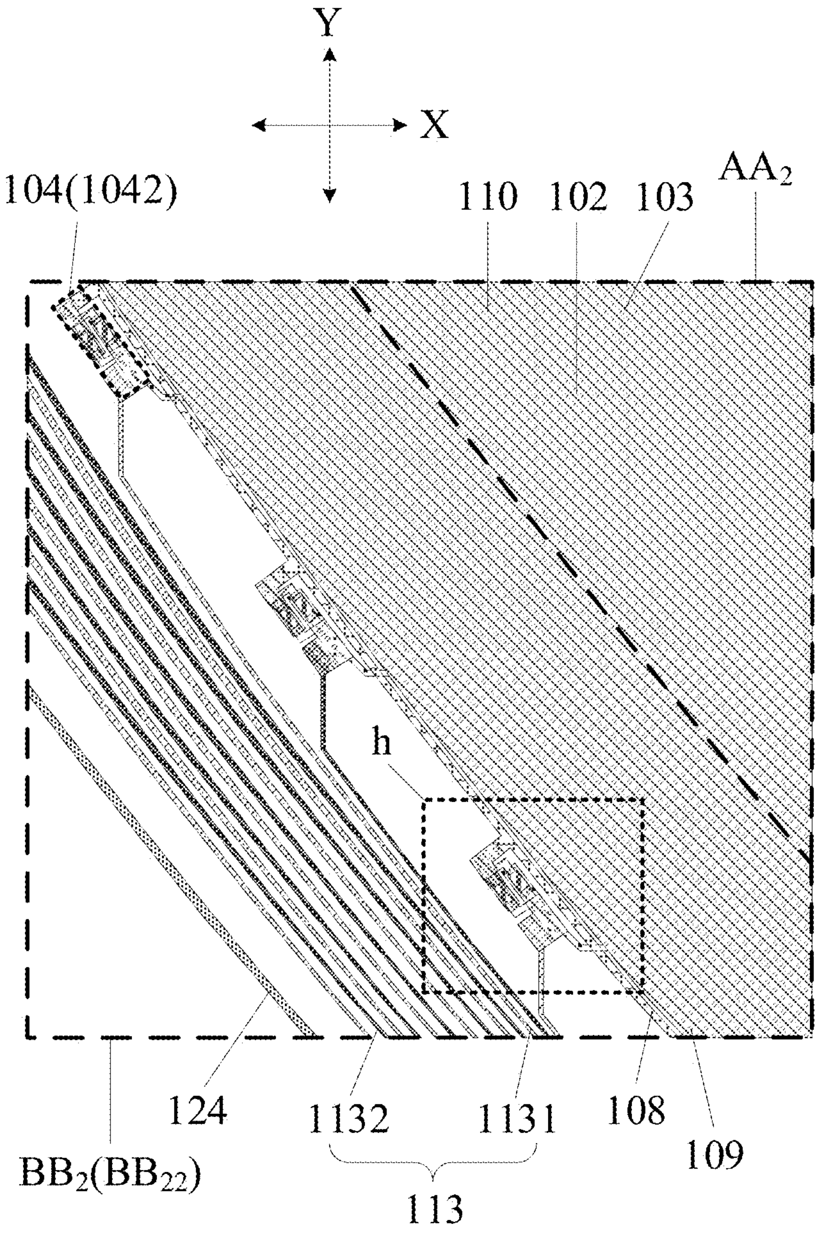
FIG. 6 is an enlarged schematic structural diagram of area c in FIG. 2.

In some embodiments, in the array substrate according to embodiments of the disclosure, as shown in FIGS. 4 to 6, at least part of the gate lines 102 are electrically connected with the anti-static structures 104 after bending the first bezel area $BB_1$ and the second bezel area $BB_2$, such that electrostatic currents on the gate lines 102 flow smoothly, and an anti-static ability is improved.

In some embodiments, in the array substrate according to embodiments of the disclosure, as shown in FIG. 3, the anti-static structures 104 electrically connected with two adjacent gate lines 102 are separately arranged on two sides of the display area AA. Compared with the solution in which the anti-static structures 104 are arranged on the same side of the display area AA, the anti-static structures 104 electrically connected with the two adjacent gate lines 102 are separately arranged on the two sides of the display area AA, such that the first bezel areas $BB_1$ on the two sides of the display area AA may be narrower, which is conducive to implementation of a narrow bezel of the first bezel area $BB_1$.

Figure 9:
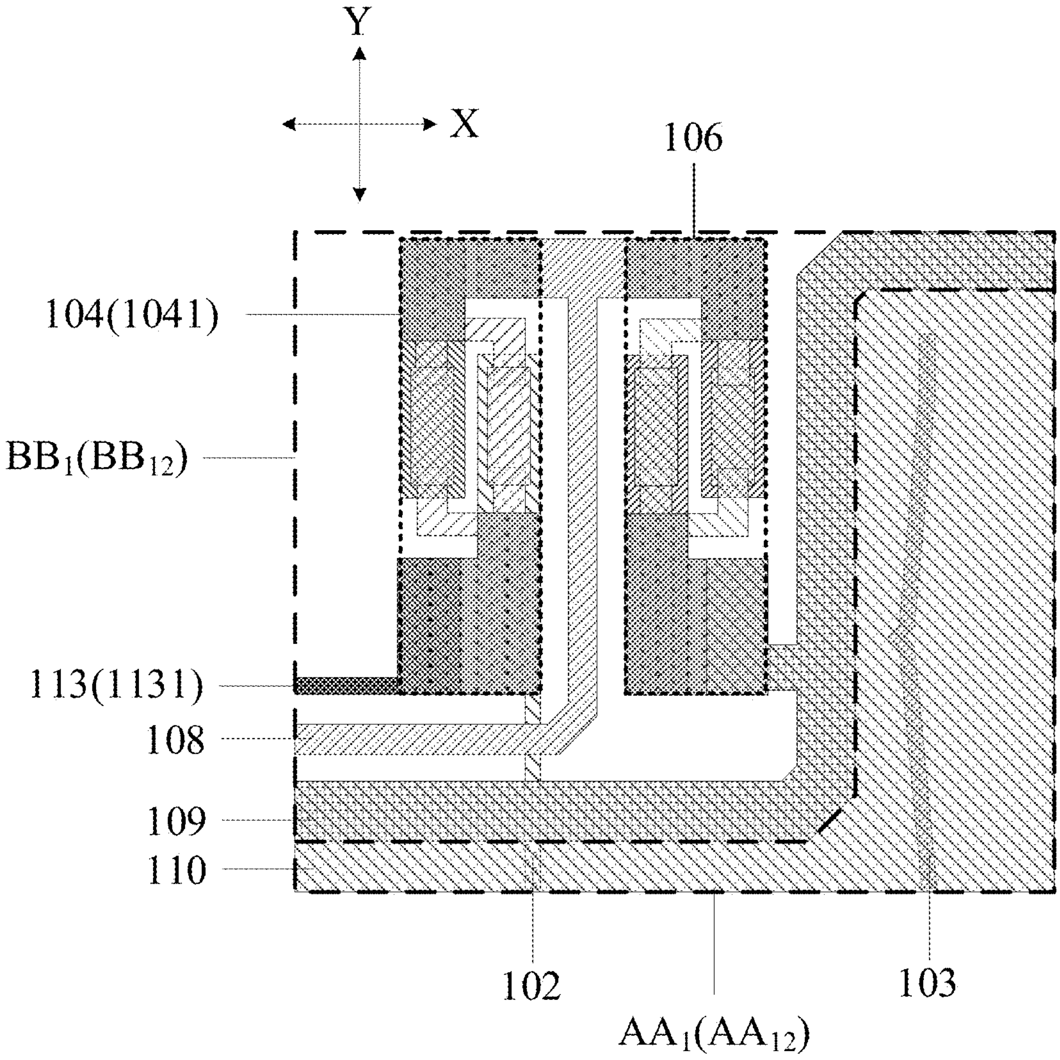
FIG. 9 is an enlarged schematic structural diagram of area d in FIG. 2.
Figure 11:
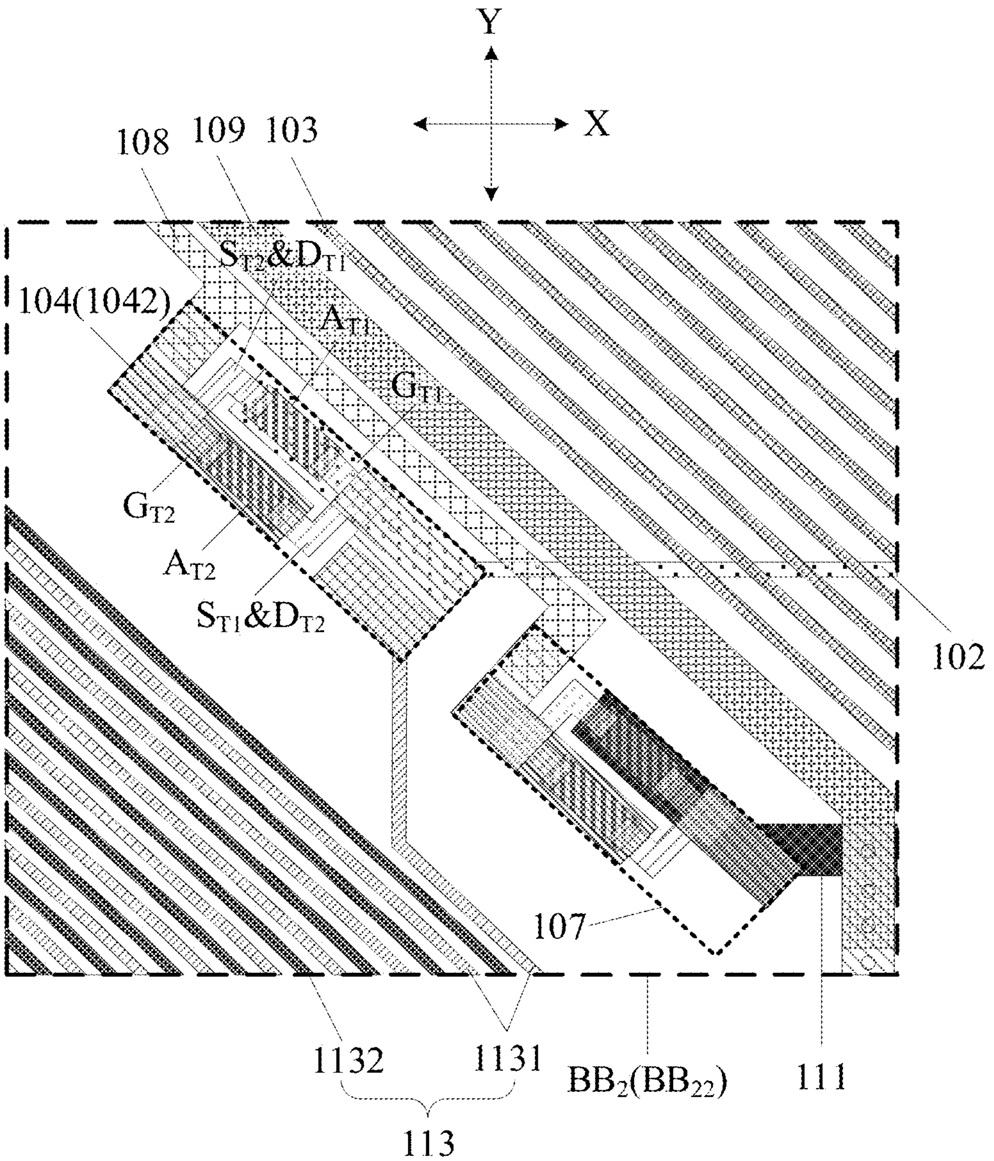
FIG. 11 is an enlarged schematic structural diagram of area f in FIG. 10.

In some embodiments, as shown in FIGS. 3, 9 and 11, the array substrate according to embodiments of the disclosure may further include a plurality of first floating anti-static structures 106 and a plurality of second floating anti-static structures 107. The plurality of first floating anti-static structures 106 are electrically connected with the plurality of first anti-static structures 1041 in the first bezel area $BB_1$, and the plurality of first floating anti-static structures 106 and two first anti-static structures 1041 (which is equivalent to the first anti-static structures 1041 electrically connected with first two gate lines 102 in a direction from the first display area $AA_1$ to the second display area $AA_2$), farthest from the second bezel area $BB_2$ in the first bezel area $BB_1$ are arranged side by side in the second direction X. The second floating anti-static structures 107 are electrically connected with the plurality of second anti-static structures 1042 in the second bezel area $BB_2$, and the plurality of second floating anti-static structures 107 and two second anti-static structures 1042 (which is equivalent to the second anti-static structures 1042 electrically connected with last two gate lines 102 in a direction from the first display area $AA_1$ to the second display area $AA_2$), farthest from the first bezel area $BB_1$ in the second bezel area $BB_2$ are arranged side by side in the winding direction of the data lines 103.

Through arrangement of the first floating anti-static structures 106 and the second floating anti-static structures 107, large currents may be quickly evacuated when static electricity occurs, such that the static electricity can be prevented from damaging products. Moreover, the condition that the first floating anti-static structure 106 and the second floating anti-static structure 107 are arranged in the second sub bezel area $BB_{12}$ and the second bezel area $BB_2$ having larger wiring spaces on left and right sides of the second sub display area $AA_{12}$ and the second display area $AA_2$ is more conducive to a smaller overall width of the bezel area BB than the condition that the first floating anti-static structure 106 and the second floating anti-static structure 107 are arranged in the first sub bezel area $BB_{11}$ having smaller wiring spaces on the left and right sides of the first sub display area $BB_{11}$.

In some embodiments, as shown in FIGS. 4 to 6 and 9 to 11, the array substrate according to embodiments of the disclosure may further include a short circuit ring 108. The short circuit ring 108 is located in the first bezel area $BB_1$ and the second bezel area $BB_2$, and may be located at the same layer as the data lines 103. The plurality of anti-static structures 104 may be electrically connected with the plurality of first floating anti-static structures 106 and the plurality of second floating anti-static structures 107 respectively by means of the short circuit ring 108, such that the static electricity is dispersed into the anti-static structure 104, the first floating anti-static structure 106 and the second floating anti-static structure 107 through the short circuit ring 108, and an anti-static ability of a product is improved.

It should be noted that in the disclosure, in the case of "the same layer", a layer structure is formed by using the same film forming process to form a film layer for making a specific pattern and using the same mask and a one-off patterning process. That is, the one-off patterning process corresponds to one mask (also called photo-mask). According to different specific patterns, the one-off patterning process may include repeated exposure, development or etching processes, and specific patterns in the formed layer structure may be continuous or not. The specific patterns may be at the same height or have the same thickness, or may be at different heights or have different thicknesses.

In some embodiments, as shown in FIGS. 4 to 6 and 9 to 11, the array substrate according to embodiments of the disclosure is further provided with a common electrode line 109 and a common electrode 110. The common electrode line 109 is located in the first bezel area $BB_1$ and the second bezel area $BB_2$, and may be attached to a boundary winding of the display area AA in the first bezel area $BB_1$ and the second bezel area $BB_2$. In some embodiments, the common electrode line 109 is arranged on the same layer as the data lines 103, and may be made of the same layer material. In this case, the same layer involved in all the embodiments may be the same layer made of the same material or different materials, which is not limited herein. The common electrode 110 extends from the first display area $AA_1$ and the second display area $AA_2$ to the first bezel area $BB_1$ and the second bezel area $BB_2$, so as to be electrically connected with the common electrode line 109. In some embodiments, the plurality of first floating anti-static structures 106 are electrically connected with the common electrode line 109. The plurality of second floating anti-static structures 107 are electrically connected with the common electrode 110. In this way, the anti-static structures 104 may be connected with the common electrode line 109 and the common electrode 110 by means of the first floating anti-static structure 106, the second floating anti-static structure 107 and the short circuit ring 108, and large currents may be guided to the common electrode line 109 and the common electrode 110 when static electricity occurs, such that the static electricity can be prevented from damaging products. Certainly, in some embodiments, the short circuit ring 108 may be connected with a ground line (GND) by means of the first floating anti-static structure 106 and the second floating anti-static structure 107, which is not limited herein.

Figure 12:
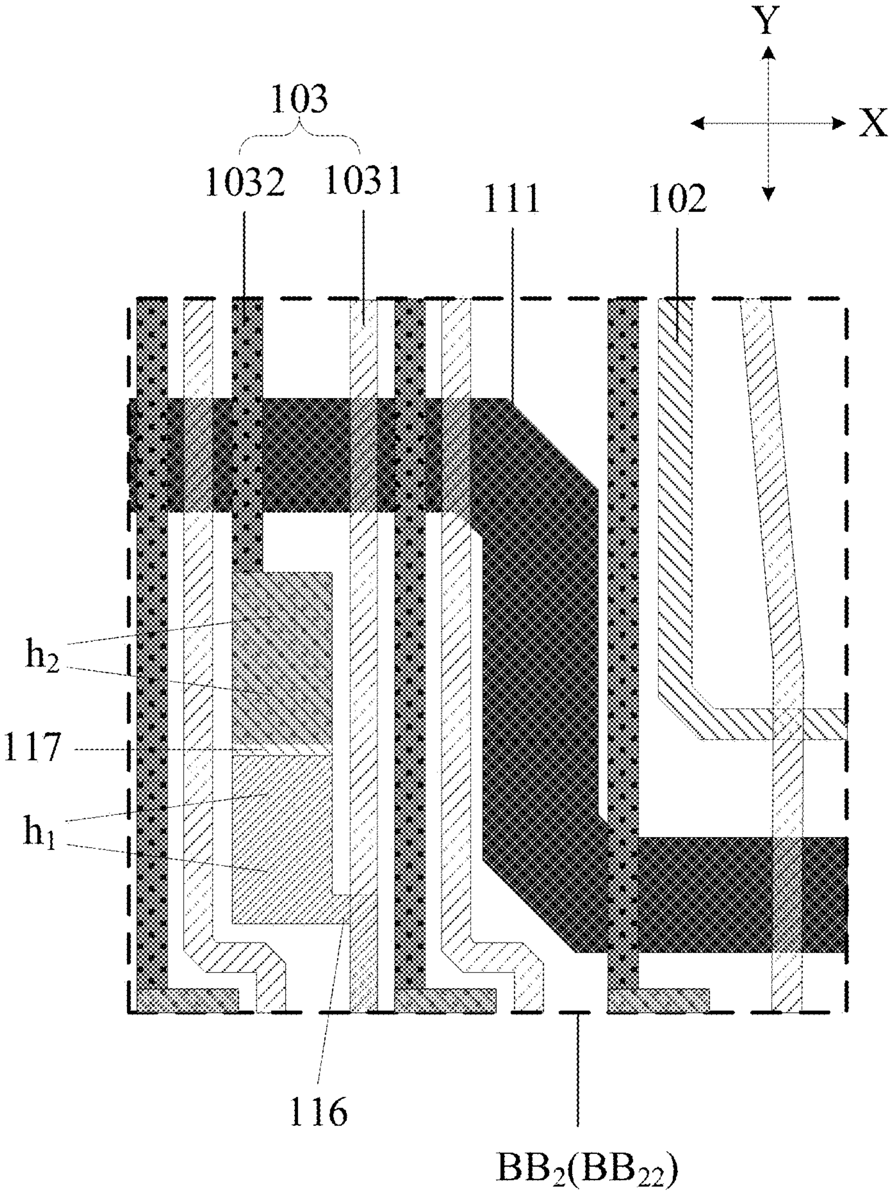
FIG. 12 is an enlarged schematic structural diagram of area g in FIG. 10.

In some embodiments, as shown in FIGS. 10 to 12, the array substrate according to embodiments of the disclosure may further include a first connecting line 111. The first connecting line 111 is located at the same layer as the plurality of gate lines 102. The first connecting line 111 is configured to connect the second floating anti-static structures 107 to the common electrode 110. In some embodiments, the first connecting line 111 and the plurality of gate lines 102 are arranged at the same layer and made of the same material.

In some embodiments, in the array substrate according to embodiments of the disclosure, as shown in FIGS. 1 to 3, the second bezel area BB2 includes a bonding area $BB_{21}$ approximately extending in the second direction X on one side of the second display area $AA_2$ away from the first display area $AA_1$, a non-rectangular area $BB_{22}$ connecting the bonding area $BB_{21}$ to the first bezel area $BB_1$, and a wiring area $BB_{23}$ located between the bonding area $BB_{21}$ and the second display area $AA_2$. The bonding area $BB_{21}$ is configured to bind a signal line (for example, the gate line 102, the data line 103, etc.) of a display panel to a flexible printed circuit board or a circuit after the signal line extends to the bonding area $BB_{21}$, so as to provide a display signal for the signal line of the display panel. As shown in FIG. 10, the array substrate further includes a second connecting line 112. The second connecting line 112 is located at the same layer (in some embodiments, at the same layer and of the same material) as the plurality of gate lines 102, and the second connecting line 112 is connected between the common electrode line 109 and the bonding area $BB_{21}$, such that a common electrode signal output by a driver chip of the bonding area $BB_{21}$ is provided for the common electrode line 109 by means of the second connecting line 112. In some embodiments, the second connecting line 112 includes a widened portion W. The widened portion W is arranged close to a joint between the wiring area $BB_{23}$ and the non-rectangular area $BB_{22}$. The widened portion W is of a grid structure. The widened portion W of the grid structure has desirable light transmittance, such that a curing effect of light rays (for example, ultraviolet light) on a bezel sealant can be improved advantageously.

Figure 15A:
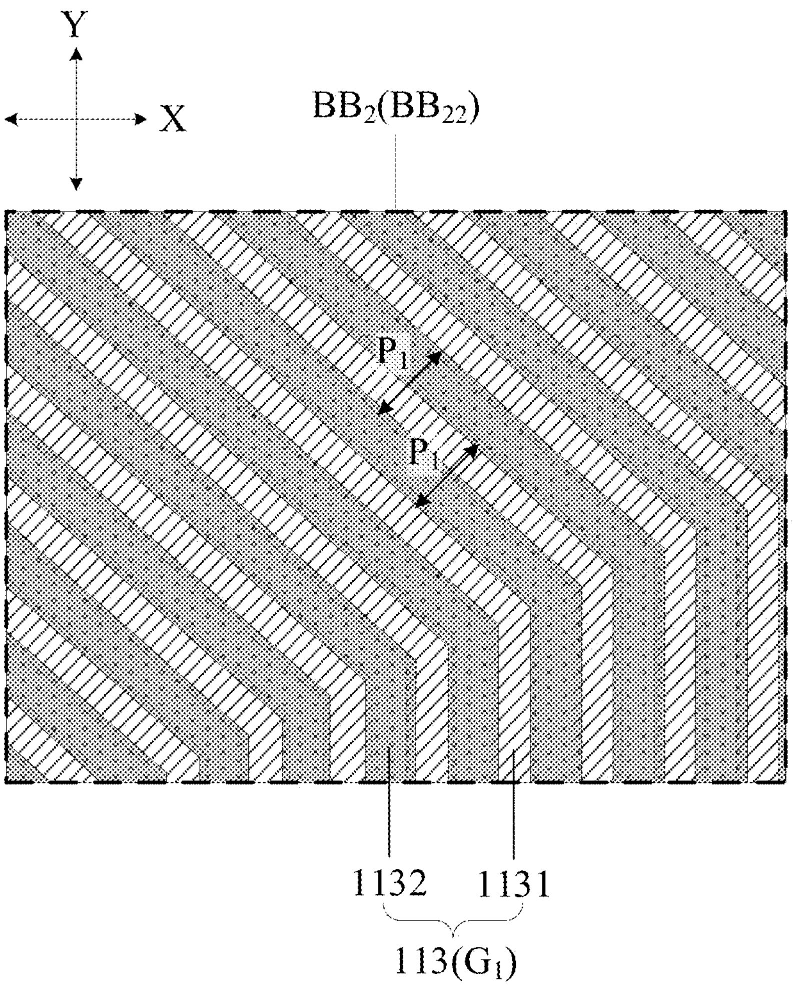
Figure 15B:
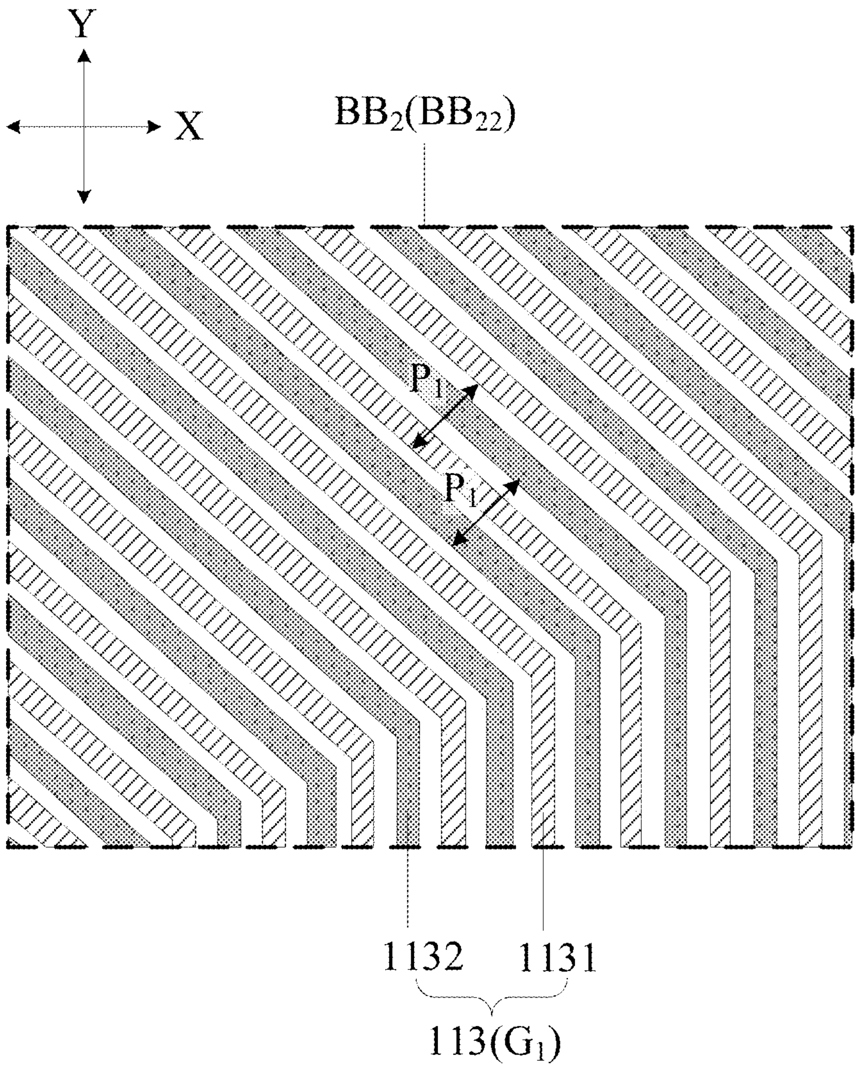
Figure 16A:
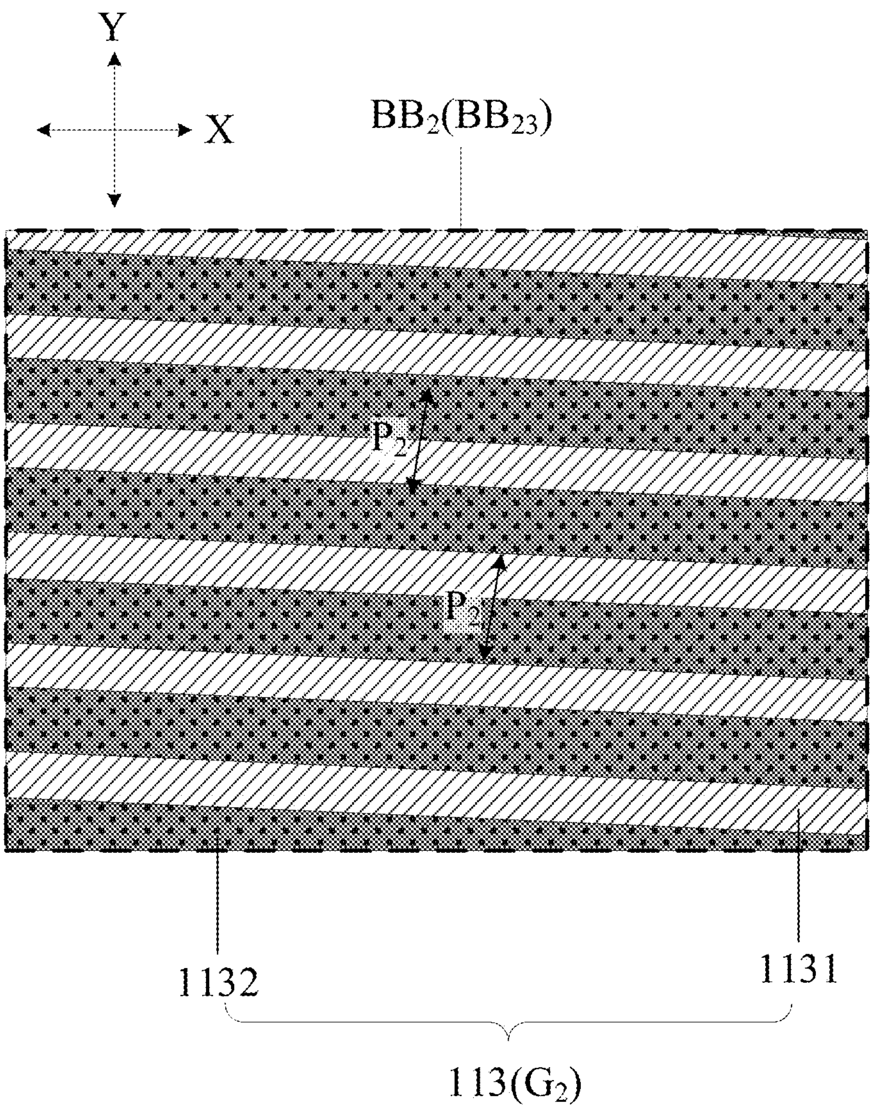
Figure 16B:
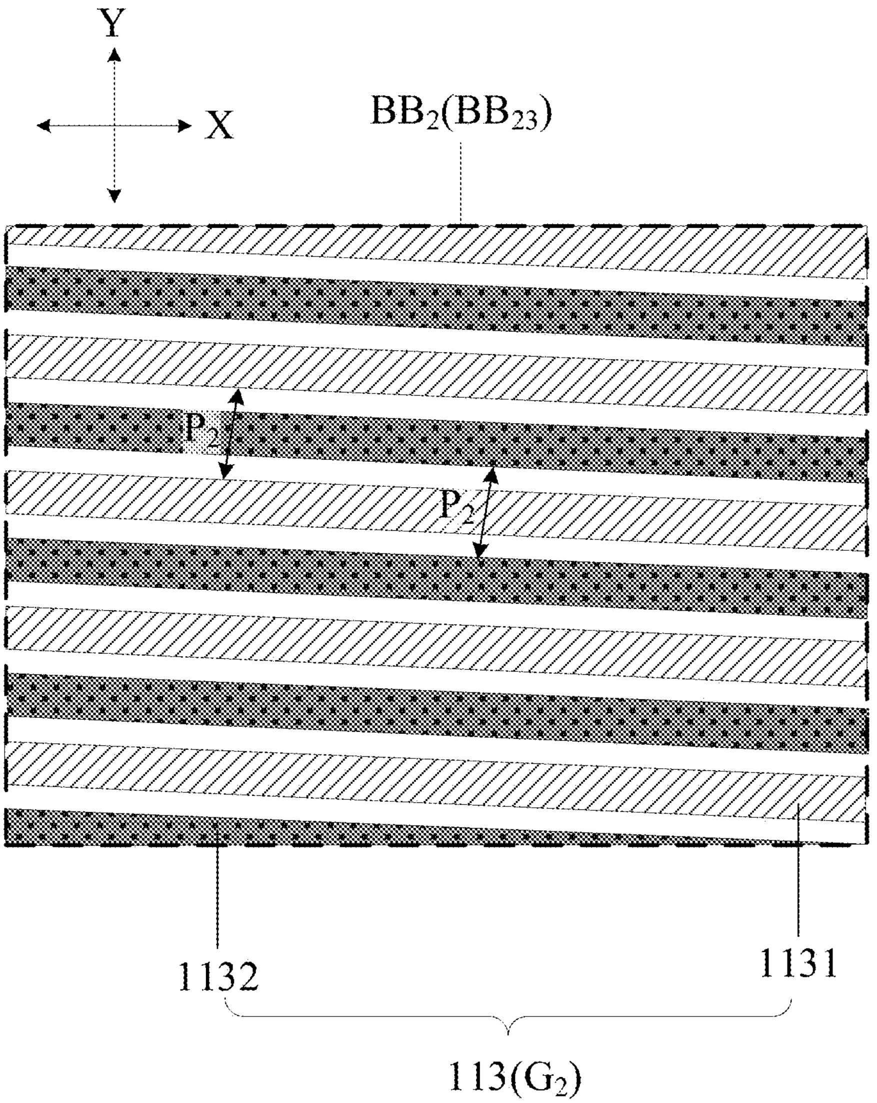

In some embodiments, as shown in FIGS. 10, 15*a*, 15*b*, 16*a*, 16*b*, 17*a* and 17*b*, the array substrate according to the embodiment of the disclosure may further include a plurality of gateway lines 113. The plurality of gateway lines 113 are electrically connected with the plurality of anti-static structures 104 at one side of the plurality of anti-static structures 104 away from the first display area $AA_1$ and the second display area $AA_2$, and only part of the gateway lines 113 extend from the second bezel area BB2 into the first bezel area $BB_1$. In some embodiments, the plurality of gateway lines 113 include a plurality of first gateway lines 1131 and a plurality of second gateway lines 1132. The plurality of first gateway lines 1131 are located at the same layer as the plurality of gate lines 102. The plurality of second gateway lines 1132 are located at the same layer as the plurality of data lines 103. An orthogonal projection of the first gateway line 1131 on the base substrate 101 at mostly partially overlaps an orthogonal projection of the second gateway line 1132 on the base substrate 101. A signal on the gateway line 113 may be ±12 V and the gateway line 113 is long. If the orthogonal projection of the first gateway line 1131 overlaps the orthogonal projection of the second gateway line 1132, the first gateway line 1131 and the second gateway line 1132 may form parasitic capacitance and interfere with each other. Therefore, in order to reduce the parasitic capacitance between the first gateway line 1131 and the second gateway line 1132 in the disclosure, the orthogonal projection of the first gateway line 1131 on the base substrate 101 is set to at mostly partially overlap the orthogonal projection of the second gateway line 1132 on the base substrate 101. Alternatively, on the premise of permission of wiring space, the orthogonal projection of the first gateway line 1131 on the base substrate 101 may be set to not overlap (that is, to be staggered from) the orthogonal projection of the second gateway line 1132 on the base substrate 101, and the orthogonal projection of the first gateway line 1131 on the base substrate 101 and the orthogonal projection of the second gateway line 1132 on the base substrate 101 may be alternately set, as shown in FIGS. 15*b*, 16*b* and 17*b*.

In some embodiments, in the array substrate according to embodiments of the disclosure, as shown in FIGS. 10, 11, 13 and 14, the anti-static structure 104 includes a first transistor $T_1$ and a second transistor $T_2$. A gate electrode $G_{T1}$ of the first transistor $T_1$ is electrically connected with the gate line 102 and the gateway line 113 separately. A first electrode $S^{T1}$ of the first transistor $T_1$ is electrically connected with the gate electrode $G_{T1}$ of the first transistor $T^1$. A second electrode $D_{T1}$ of the first transistor $T_1$ is integrated with a first electrode $S^{T2}$ of the second transistor $T_2$. A second electrode $D_{T2}$ of the second transistor $T_2$ is integrated with the first electrode $S_{T1}$ of the first transistor $T_1$, and a gate electrode $G_{T2}$ of the second transistor $T_2$ is electrically connected with the first electrode $S_{T2}$ of the second transistor $T_2$ and the short circuit ring 108. When a large amount of static electricity occurs on the gate line 102, the first transistor $T_1$ is turned on, and the static electricity is guided to the short circuit ring 108 and then output to the common electrode line 109 for release. When a large amount of static electricity occurs on the short circuit ring 108, the static electricity may be directly released to the common electrode line 109, and further the second transistor $T_2$ is turned on, and the static electricity is dispersed to the gate line 102 and the gateway line 113. In this way, the first transistor $T_1$ and the second transistor $T_2$ effectively avoid excessive concentration of the static electricity, such that an anti-static effect can be improved.

It should be noted that when the anti-static structure 104 in the disclosure includes the first transistor $T_1$ and the second transistor $T_2$, an extending direction of the anti-static structure 104 in the disclosure may be understood as an extending direction of an active layer of a transistor (in the extending direction of the active layer, a length of the active layer is longer). That is, the condition that the first anti-static structure 1041 extends in the first direction Y is equivalent to the condition that an active layer $A_{T1}$ of the first transistor $T_1$ and an active layer $A_{T2}$ of the second transistor $T_2$ extend in the first direction Y, and the condition that the second anti-static structure 1042 extends in the winding direction of the data line 103 is equivalent to the condition that the active layer $A_{T1}$ of the first transistor $T_1$ and the active layer $A_{T2}$ of the second transistor $T_2$ extend in the winding direction of the data line 103. In addition, the first floating anti-static structure 106 and the second floating anti-static structure 107 in the disclosure may also include first transistors $T_1$ and second transistors $T_2$, and are different from the anti-static structure 104 in that the gate electrodes $G_{T1}$ of the first transistors $T_1$ are electrically connected with the common electrode line 109 in the first floating anti-static structure 106 and the second floating anti-static structure 107. In addition, the first transistor $T_1$ and the second transistor $T_2$ in the disclosure may be bottom gate transistors. That is, a layer where the gate electrode is located is located between the active layer and the base substrate 101. Certainly, in some embodiments, the first transistor $T_1$ and the second transistor $T_2$ may be top gate transistors. That is, the active layer is located between the layer where the gate electrode is located and the base substrate 101.

Figure 13:
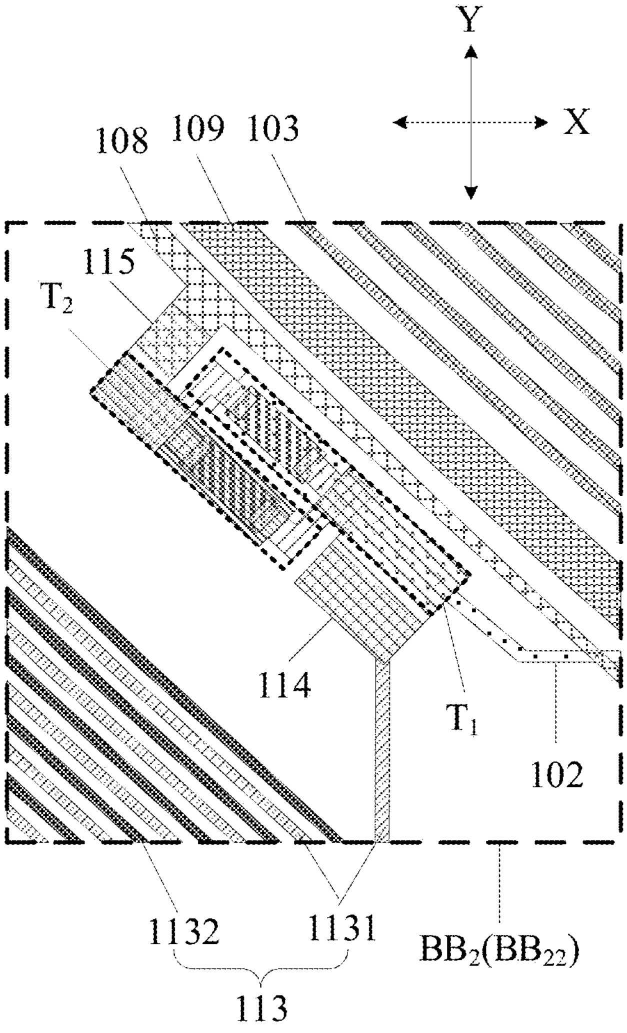
FIG. 13 is an enlarged schematic structural diagram of area h in FIG. 6.
Figure 14:
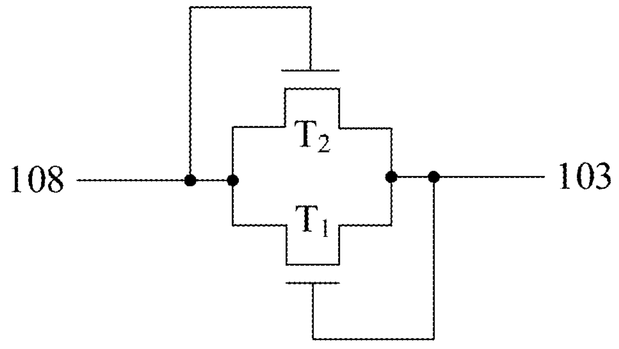
FIG. 14 is an equivalent circuit diagram of an anti-static structure according to an embodiment of the disclosure.

In some embodiments, as shown in FIG. 13, the array substrate according to embodiments of the disclosure may further include a plurality of first adapter electrodes 114 and a plurality of second adapter electrodes 115. The plurality of first adapter electrodes 114 and the plurality of second adapter electrodes 115 are arranged at a same layer, and are on a side of a layer where the plurality of gate lines 102 are located and a layer where the plurality of data lines 103 are located facing away from the base substrate 101. The gate electrode $G_{T1}$ of the first transistor $T_1$ is electrically connected with the gate line 102 and the gateway line 113 separately by means of the first adapter electrode 114. The gate electrode $G_{T1}$ of the second transistor $T_2$ is electrically connected with the first electrode $S_{T2}$ of the second transistor $T_2$ and the short circuit ring 108 separately by means of the second adapter electrode 115. In some embodiments, the adapter electrode may have the same width as the gate electrode of the transistor and may be wider than the gate line 102. For example, the width is located at least 1.5 times a width of the gate line 102.

In some embodiments, in the array substrate according to embodiments of the disclosure, as shown in FIGS. 10, 15*a*, 15*b*, 16*a*, 16*b*, 17*a* and 17*b*, the gateway line 113 includes a first gateway line segment $G_1$ located in the non-rectangular area $BB_{22}$, a second gateway line segment $G_2$ located in the wiring area $BB_{23}$, and a third gateway line segment $G_3$ connecting the first gateway line segment $G_1$ to the second gateway line segment $G_2$. A sum of a line width of the first gateway line segment $G_1$ and a line distance between adjacent first gateway line segments $G_1$ at the same layer is a first distance $P_1$. A sum of a line width of the second gateway line segment $G_2$ and a line distance between adjacent second gateway line segments $G_2$ at the same layer is a second distance $P_2$. A sum of a line width of the third gateway line segment $G_3$ and a line distance between adjacent third gateway line segments $G_3$ at the same layer is a third distance $P_3$. A ratio of the first distance $P_1$ to the second distance $P_2$ is greater than 1 and smaller than or equal to 1.5. In some embodiments, the second distance $P_2$ is approximately equal to (that is, equal to or smaller than an error (for example, ±5%) caused by factors such as manufacture and measurement) the third distance $P_3$. In some embodiments, the first distance $P_1$ is 6.5 μm, 7 μm, 7.5 μm, 8 μm, 8.5 μm, 9 μm, etc., and the second distance $P_2$ is 6 μm, 6.1 μm, 6.2 μm, 6.3 μm, 6.4 μm, 6.5 μm, etc.

The plurality of gateway lines 113 have a plurality of wiring angles in the non-rectangular area $BB_{22}$, so compensation design needs to be conducted to ensure better line width uniformity of different gateway lines 113 when the line width is small. However, when there are the plurality of compensation angles, compensation errors are likely to occur, which lead to short circuit or poor open circuit of a product. Since the second anti-static structure 1042 is arranged to extend in the winding direction of the data lines 103 in the disclosure, space occupied by the second anti-static structure 1042 can be reduced advantageously. The saved space may be configured to increase a wiring pitch, increase a process margin, and avoid defects. Based on this, the wiring pitch (that is, the first distance $P_1$) of the first gateway line segment $G_1$ is increased in the disclosure. In some embodiments, the wiring pitch of the first gateway line segment $G_1$ may be increased by increasing the line width of the first gateway line segment $G_1$ and/or the line distance between adjacent first gateway line segments $G_1$ at the same layer. For example, the line width of the first gateway line segment $G^1$ is increased from 3.7 μm to 4.8 μm, and the line distance between adjacent first gateway line segments $G_1$ at the same layer is increased from 2.5 μm to 3.2 μm.

In some embodiments, as shown in FIGS. 10 and 18, the array substrate according to embodiments of the disclosure may further include a plurality of third connecting lines 116. The plurality of third connecting lines 116 are located at the same layer as the plurality of gate lines 102. The plurality of data lines 103 include first data lines 1031 and second data lines 1032 that are alternately arranged. The first data lines 1031 cross from the first display area $AA_1$ and the second display area $AA_2$ over the non-rectangular area $BB_{22}$ and extend to the bonding area $BB_{21}$. The second data lines 1032 cross from the first display area $AA_1$ and the second display area $AA_2$ over the non-rectangular area $BB_{22}$ and are connected with the bonding area $BB_{21}$ through the third connecting lines 116. The second data line 1032 is switched to the bonding area $BB_{21}$ with the third connecting line 116 at the same layer as the gate line 102, such that a total number of wires at the layer where the plurality of data lines 103 are located is reduced, which is conducive to narrow bezel design.

In some embodiments, in the array substrate according to embodiments of the disclosure, as shown in FIGS. 10 and 18, an orthogonal projection of the third connecting line 116 on the base substrate 101 at least partially overlaps with an orthogonal projection of the adjacent first data line 1031 on the base substrate 101. Because a signal on the data line 103 is small and may be, for example, ±5 V and the data line 103 is short, even if an orthogonal projection of the first data line 1031 overlaps the orthogonal projection of the third connecting line 116, the first data line and the third connecting line cannot form great parasitic capacitance. Based on this, the orthogonal projection of the third connecting line 116 on the base substrate 101 may be set to at least partially overlap the orthogonal projection of the adjacent first data line 1031 on the base substrate 101 in the disclosure.

In some embodiments, as shown in FIGS. 18 and 19, the array substrate according to embodiments of the disclosure further includes a plurality of third adapter electrodes 117, a first insulation layer 118, and a second insulation layer 119. A layer where the plurality of third adapter electrodes 117 are located is on a side of the layer where the plurality of gate lines 102 are located and the layer where the plurality of data lines 103 are located facing away from the base substrate 101. The first insulation layer 118 is located between the layer where the plurality of gate lines 102 are located and the layer where the plurality of data lines 103 are located. The second insulation layer 119 is located between the layer where the plurality of data lines 103 are located and the layer where the plurality of third adapter electrodes 117 are located. In addition, the third adapter electrode 117 is electrically connected with the third connecting line 116 by means of at least one first via hole $h_1$ penetrating the first insulation layer 118 and the second insulation layer 119. The third adapter electrode 117 is electrically connected with the second data line 1032 by means of at least one second via hole $h_2$ penetrating the second insulation layer 119. The at least one first via hole $h_1$ and the at least one second via hole $h_2$ corresponding to the same third adapter electrode 117 are provided in the first direction Y, such that a wiring space is reduced.

In some embodiments, as shown in FIGS. 10 and 20, the array substrate according to the embodiment of the disclosure may further include a plurality of fourth connecting lines 120 and a plurality of fifth connecting lines 121. The plurality of fourth connecting lines 120 are located at the same layer as the plurality of gate lines 102. The plurality of fifth connecting lines 121 are located at the same layer as the plurality of data lines 103. The plurality of data lines 103 include third data lines 1033 and fourth data lines 1034 that are alternately arranged. The third data lines 1033 extend from the first display area $AA_1$ and the second display area $AA_2$ to the wiring area $BB_{23}$ and are connected with the bonding area $BB_{21}$ through the fourth connecting lines 120. The fourth data lines 1034 extend from the first display area $AA_1$ and the second display area $AA_2$ to the wiring area $BB_{23}$ and are connected with the bonding area $BB_{21}$ through the fifth connecting lines 121. The wiring area $BB_{23}$ has a sufficient wiring space, so the third data line 1033 and the fourth data line 1034 may be connected with the bonding area $BB_{21}$ by means of the fourth connecting line 120 and the fifth connecting line 121, respectively. In addition, the third data line 1033 is switched to the bonding area $BB_{21}$ with the fourth connecting line 120 at the same layer as the gate line 102, such that a total number of wires at the layer where the plurality of data lines 103 are located is reduced, which is conducive to narrow bezel design.

In some embodiments, in the array substrate according to embodiments of the disclosure, as shown in FIGS. 10 and 20, an orthogonal projection of the fourth connecting line 120 on the base substrate 101 at least partially overlaps an orthogonal projection of the fifth connecting line 121 on the base substrate 101. Because data signals transmitted on the fourth connecting line 120 and the fifth connecting line 121 are great and may be, for example, ±5 V and the fourth connecting line 120 and the fifth connecting line 121 are short, even if the orthogonal projection of the fourth connecting line 120 overlaps the orthogonal projection of the fifth connecting line 121, the fourth connecting line and the fifth connecting line cannot interfere with each other due to parasitic capacitance. Based on this, the orthogonal projection of the fourth connecting line 120 on the base substrate 101 may be set to at least partially overlap the orthogonal projection of the fifth connecting line 121 on the base substrate 101 in the disclosure. Moreover, due to a great number of fourth connecting lines 120 and a great number of fifth connecting lines 121, a wiring space can be reduced by overlapping the fourth connecting lines and the fifth connecting lines, which is conducive to narrow bezel design.

In some embodiments, as shown in FIG. 20, the array substrate according to embodiments of the disclosure may further include a plurality of fourth adapter electrodes 122 and a plurality of fifth adapter electrodes 123. The plurality of fourth adapter electrodes 122 and the plurality of fifth adapter electrodes 123 may be arranged at the same layer, and are on a side of the layer where the plurality of gate lines 102 are located and the layer where the plurality of data lines 103 are located facing away from the base substrate 101. The fourth adapter electrode 122 is electrically connected with the fourth connecting line 120 by means of at least one third via hole h3 penetrating the first insulation layer 118 and the second insulation layer 119. The fourth adapter electrode 122 is electrically connected with the third data line 1033 by means of at least one fourth via hole $h_4$ penetrating the second insulation layer 119. Because a wiring space of the wiring area $BB_{23}$ is sufficient, the at least one third via hole $h_3$ and the at least one fourth via hole $h_4$ corresponding to the same fourth adapter electrode 122 are separately provided in the second direction X. The fifth adapter electrode 123 is electrically connected with the fifth connecting line 121 by means of at least one fifth via hole $h_5$ penetrating the second insulation layer 119. The fifth adapter electrode 123 is electrically connected with the fourth data line 1034 by means of at least one sixth via hole he penetrating the second insulation layer 119. Because a wiring space of the wiring area $BB_{23}$ is sufficient, the at least one fifth via hole $h_5$ and the at least one sixth via hole he corresponding to the same fifth adapter electrode 123 may be separately provided in the second direction X.

In some embodiments, in order to reduce a number of film layers and a number of patterning times, the first adapter electrode 114, the second adapter electrode 115, the third adapter electrode 117, the fourth adapter electrode 122 and the fifth adapter electrode 123 in the disclosure may be arranged at the same layer, and for example, each adapter electrode is arranged at the same layer as the common electrode 110. In addition, the first via hole $h_1$ and the third via hole $h_3$ penetrating the first insulation layer 118 and the second insulation layer 119, and the second via hole $h_2$, the fourth via hole $h_4$, the fifth via hole $h_5$ and the sixth via hole $h_6$ penetrating the second insulation layer 119 may be formed through a one-off patterning process.

In some embodiments, in the array substrate according to the embodiment of the disclosure, as shown in FIGS. 10 and 21 to 23, the first data line 1031 includes a first data line segment $S_1$ located in the non-rectangular area $BB_{22}$ and a second data line segment $S_2$ located in the wiring area $BB_{23}$. A sum of a line width of the first data line segment $S_1$ and a line distance between adjacent first data line segments $S_1$ is a fourth distance $P_4$. A sum of a line width of the second data line segment $S_2$ and a line distance between adjacent second data line segments $S_2$ is a fifth distance $P_5$. A ratio of the fourth distance $P_4$ to the fifth distance $P_5$ is greater than 1 and smaller than or equal to 1.5. In some embodiments, the fourth distance $P_4$ is 6.5 μm, 7 μm, 7.5 μm, 8 μm, etc., and the fifth distance $P_5$ is 6 μm, 6.1 μm, 6.2 μm, 6.3 μm, 6.4 μm, etc.

Because the gate line 102 needs to be guided from the display area AA and cross the first data line segment $S_1$ so as to be connected with the anti-static structure 104, the first data line segments $S_1$ are distributed in oblique stripes, and tilt directions of the first data line segments $S_1$ on left and right sides of the second display area $AA_2$ are just opposite. The line width and the line distance of each first data line segment $S_1$ are balanced with each other. When the line distance is small, a short circuit is likely to occur. When the line width is small, an open circuit is likely to occur. Since the second anti-static structure 1042 is arranged to extend in the winding direction of the data lines 103 in the disclosure, space occupied by the second anti-static structure 1042 can be reduced advantageously. The saved space may be configured to increase a wiring pitch, increase a process margin, and avoid defects. Based on this, a wiring pitch (that is, the fourth distance $P_4$) of the first data line segment $S_1$ is increased in the disclosure. In some embodiments, the wiring pitch of the first data line segment $S_1$ may be increased by increasing the line width of the first data line segment $S_1$ and/or the line distance between adjacent first gateway line segments $G_1$ at the same layer. For example, the line width of the first data line segment $S_1$ is increased from 3.3 μm to 4.2 μm, and the line distance between adjacent first data line segments $S_1$ is increased from 2.7 μm to 2.8 μm.

In some embodiments, as shown in FIG. 10, the array substrate according to the embodiment of the disclosure may further include a ground line 124. The ground line 124 is arranged at the same layer as the plurality of gate lines 102. The ground line 124 is located on one side of the plurality of gateway lines 113 away from the plurality of anti-static structures 104, and arranged in a space on one side of the ground line 124 away from the plurality of gateway lines 113. That is, the ground line 124 is arranged on an outermost periphery of the bezel area BB. In the related art, a common electrode line is further arranged in addition to the ground line 124. The disclosure omits the common electrode line, such that it can be ensured that all the wires in the bezel area BB are covered with a bezel sealant in consideration of process fluctuation, all the wires in the bezel area BB are better protected, and oxidation and other defects of all the wires in the bezel area BB are avoided. In addition, the ground line 124 may further prevent external static electricity from entering the display area AA, so as to achieve an anti-static effect.

In some embodiments, as shown in FIGS. 4 and 5, the array substrate according to the embodiment of the disclosure further includes a plurality of floating blocks 125. The plurality of floating blocks 125 are arranged at the same layer as the plurality of gate lines 102, and the plurality of floating blocks 125 are approximately evenly distributed between the ground line 124 and the plurality of gateway lines 113. That is, a distribution density of the plurality of floating blocks 125 in an area between the ground line 124 and the plurality of gateway lines 113 is equal to or smaller than a rational error caused by factors such as manufacture and measurement. Because a distance between the ground line 124 and a closest gateway line 113 is greater than a distance between two adjacent gateway lines 113, a supporting effect of the bezel sealant may be reduced in the area between the ground line 124 and the plurality of gateway lines 113. Moreover, because a number of wires in the first bezel area $BB_1$ is smaller than that in the second bezel area BB2, a supporting effect of the bezel sealant in the first bezel area $BB_1$ is not ideal. In the disclosure, the floating blocks 125 are evenly distributed in the area between the ground line 124 and the plurality of gateway lines 113, such that the bezel sealant can be effectively supported, and meanwhile, the floating blocks 125 can further play an anti-static role to some extent.

In some embodiments, as shown in FIG. 24, the array substrate according to the embodiment of the disclosure may further include a pixel electrode 126 located in the display area AA, a switching transistor 127 connecting the pixel electrode 126 to the data line 103, etc. In some embodiments, the pixel electrode 126 is a block electrode in a pixel opening area, and the common electrode 110 is provided with a slit in the pixel opening area. In some embodiments, the pixel electrode 126 is located between the first insulation layer 118 and the second insulation layer 119, and the common electrode 110 is located on one side of the second insulation layer 119 away from the base substrate 101. Other essential components of the array substrate should be understood by those of ordinary skill in the art, which will not be repeated herein and should not limit the disclosure.

Based on the same inventive concept, an embodiment of the disclosure provides a display apparatus. As shown in FIG. 25, the display apparatus includes the array substrate 001 according to the embodiments of the disclosure and a driver chip 002. The driver chip 002 may be electrically connected with a plurality of gate lines 102 and a plurality of data lines 103. In some embodiments, the driver chip 002 is further electrically connected with a flexible printed circuit board 003. In some embodiments, a number of driver chips 002 may be one or a plurality, which is not limited herein. A problem solving principle of the display apparatus is similar to a problem solving principle of the array substrate, so reference may be made to the embodiments of the array substrate for implementation of the display apparatus, which will not be repeated herein.

In some embodiments, the display apparatus according to embodiments of the disclosure may be a liquid crystal display. The liquid crystal display may include a backlight module and a display panel located on a light emitting side of the backlight module. The display panel includes a display substrate and an opposite substrate that are opposite each other, a liquid crystal layer between the display substrate and the opposite substrate, a sealant, surrounding the liquid crystal layer, between the display substrate and the opposite substrate, a first polarizer on one side of the display substrate away from the liquid crystal layer, and a second polarizer on one side of the opposite substrate away from the liquid crystal layer. A polarization direction of the first polarizer is perpendicular to a polarization direction of the second polarizer. The backlight module may be a direct-lit backlight module or an edge-lit backlight module. In some embodiments, the edge-lit backlight module may include a light bar, and a reflective sheet, a light guide plate, a diffusion sheet, a prism group, etc. that are stacked. The light bar is located on one side of the light guide plate in a thickness direction. The direct-lit backlight module may include a matrix light source, and a reflective sheet, a diffusion plate, a brightness enhancement film, etc. that are stacked on a light emitting side of the matrix light source. The reflective sheet includes openings arranged directly facing a position of each lamp bead in the matrix light source. The light beads in the light bar and the light beads in the matrix light source may be light emitting diodes (LEDs), such as mini LEDs and micro LEDs.

Like organic light emitting diodes (OLEDs), submillimeter-scale or even micron-scale micro light emitting diodes belong to self-luminous devices. Like the organic light emitting diodes, the submillimeter-scale or even micron-scale micro light emitting diodes have a series of advantages, such as high brightness, ultra-low delay and a super-large viewing angle. Moreover, an inorganic light emitting diode emits light on the basis of a metal semiconductor having more stable properties and lower resistance, such that the inorganic light emitting diode has lower power consumption, higher resistance to high and low temperature and longer service life than an organic light emitting diode that emits light on the basis of organic substances. When a micro light emitting diode is used as a backlight source, a more precise dynamic backlight effect can be achieved, brightness and contrast of a screen can be effectively improved, and meanwhile, a glare phenomenon caused by traditional dynamic backlight between bright and dark areas of the screen can be avoided, which optimizes visual experience.

In some embodiments, the display apparatus according to embodiments of the disclosure may be any product or component having a display function, such as a smart watch, a projector, a three dimensional (3D) printer, a virtual reality device, a mobile phone, a tablet computer, a television, a display, a notebook computer, a digital photo frame, a navigator, a fitness wristband, and a personal digital assistant. The display apparatus may include, but is not limited to, a radio frequency unit, a network module, an audio output-input unit, a sensor, a display unit, a user input unit, an interface unit, a control chip, and other components. In some embodiments, the control chip is a central processing unit, a digital signal processor, a system-on-a-chip (SoC), etc. For example, the control chip may further include a memory, a power module, etc., and power supply and signal input and output functions are achieved through additionally arranged wires and signal lines. For example, the control chip may further include a hardware circuit and a computer executable code. The hardware circuit may include a conventional very large scale integration (VLSI) circuit or a gate array and existing semiconductors such as a logic chip and a transistor or other discrete elements. The hardware circuit may further include a field programmable gate array, a programmable array logic, a programmable logic device, etc. In addition, those skilled in the art can understand that the above structure does not limit the display apparatus according to the embodiment of the disclosure. That is, the display apparatus according to the embodiment of the disclosure may include more or less components, or combine some components, or have different component arrangements.

Although preferred embodiments of the disclosure are described, those skilled in the art can still make additional changes and modifications to the embodiments once they learn the basic inventive concept. Therefore, the appended claims are intended to be interpreted as including the preferred embodiments and all changes and modifications falling within the scope of the disclosure.

Apparently, those skilled in the art can make various modifications and variations to the embodiments of the disclosure without departing from the spirit and scope of the embodiments of the disclosure. In this way, if these modifications and variations of the embodiments of the disclosure fall within the scope of the claims of the disclosure and their equivalent technologies, the disclosure is also intended to cover these modifications and variations.

What is claimed is:

1. An array substrate, comprising:

a base substrate, wherein the base substrate comprises a display area and a bezel area surrounding the display area, the display area comprises a first display area and a second display area that are sequentially arranged in a first direction, and the second display area is a non-rectangular display area; and the bezel area comprises a first bezel area surrounding the first display area and a second bezel area surrounding the second display area;

a plurality of gate lines arranged in the first direction and extending in a second direction in the first display area and the second display area, wherein the gate lines in the first display area extend to the first bezel area, the gate lines in the second display area extend to the second bezel area, and the second direction intersects with the first direction;

a plurality of data lines insulated from the plurality of gate lines, wherein the plurality of data lines are arranged in the second direction and extend in the first direction in the first display area and the second display area, and the plurality of data lines extend to the second bezel area and are arranged around the second display area in the second bezel area; and a plurality of anti-static structures electrically connected with the plurality of gate lines, wherein the plurality of anti-static structures comprise a plurality of first anti-static structures located in the first bezel area and a plurality of second anti-static structures located in the second bezel area, wherein at least part of the first anti-static structures extend in the first direction, and at least part of the second anti-static structures extend in a winding direction of the data lines.

2. The array substrate according to claim 1, wherein the anti-static structures electrically connected with two adjacent gate lines are separately arranged on two sides of the display area.

3. The array substrate according to claim 2, further comprising a plurality of first floating anti-static structures and a plurality of second floating anti-static structures;

wherein the plurality of first floating anti-static structures are electrically connected with the plurality of first anti-static structures in the first bezel area, and the plurality of first floating anti-static structures and two first anti-static structures, farthest from the second bezel area, in the first bezel area are arranged side by side in the second direction; and the second floating anti-static structures are electrically connected with the plurality of second anti-static structures in the second bezel area, and the plurality of second floating anti-static structures and two second anti-static structures, farthest from the first bezel area, in the second bezel area are arranged side by side in the winding direction of the data lines.

4. The array substrate according to claim 3, further comprising a short circuit ring, wherein the short circuit ring is located in the first bezel area and the second bezel area; and the plurality of anti-static structures are electrically connected with the plurality of first floating anti-static structures and the plurality of second floating anti-static structures respectively by means of the short circuit ring.

5. The array substrate according to claim 4, further comprising a common electrode line and a common electrode, wherein the common electrode line is located in the first bezel area and the second bezel area, and the common electrode extends from the first display area and the second display area to the first bezel area and the second bezel area; and the plurality of first floating anti-static structures are electrically connected with the common electrode line, and the plurality of second floating anti-static structures are electrically connected with the common electrode.

6. The array substrate according to claim 5, further comprising a first connecting line, wherein the first connecting line is arranged at the same layer as the plurality of gate lines, and the first connecting line connects the second floating anti-static structures with the common electrode; or the short circuit ring and the common electrode line are both arranged at the same layer as the plurality of data lines.

7. The array substrate according to claim 5, wherein the second bezel area comprises: a bonding area approximately extending in the second direction on a side of the second display area far away from the first display area;

a non-rectangular area connecting the bonding area with the first bezel area; and a wiring area located between the bonding area and the second display area;

the array substrate further comprises a second connecting line, the second connecting line is arranged at the same layer as the plurality of gate lines, the second connecting line is connected between the common electrode line and the bonding area, the second connecting line comprises a widened portion, the widened portion is arranged close to a joint between the wiring area and the non-rectangular area, and the widened portion is of a grid structure.

8. The array substrate according to claim 4, further comprising a plurality of gateway lines, wherein the plurality of gateway lines are electrically connected with the plurality of anti-static structures at one sides of the plurality of anti-static structures far away from the first display area and the second display area; and the plurality of gateway lines comprise a plurality of first gateway lines and a plurality of second gateway lines, the plurality of first gateway lines are arranged at the same layer as the plurality of gate lines, and the plurality of second gateway lines are arranged at the same layer as the plurality of data lines.

9. The array substrate according to claim 8, wherein the anti-static structure comprises a first transistor and a second transistor;

wherein a gate electrode of the first transistor is electrically connected with the gate line and the gateway line separately;

a first electrode of the first transistor is electrically connected with the gate electrode of the first transistor;

a second electrode of the first transistor is integrated with a first electrode of the second transistor;

a second electrode of the second transistor is integrated with the first electrode of the first transistor; and a gate electrode of the second transistor is electrically connected with the first electrode of the second transistor and the short circuit ring; or wherein the array substrate further comprises a ground line, wherein the ground line is arranged at the same layer as the plurality of gate lines, and the ground line is located on one side of the plurality of gateway lines far away from the plurality of anti-static structures.

10. The array substrate according to claim 9, further comprising a plurality of first adapter electrodes and a plurality of second adapter electrodes, wherein the plurality of first adapter electrodes and the plurality of second adapter electrodes are arranged at a same layer, and are on a side of a layer where the plurality of gate lines are located and a layer where the plurality of data lines are located facing away from the base substrate; and the gate electrode of the first transistor is electrically connected with the gate line and the gateway line separately by means of the first adapter electrode; and the gate electrode of the second transistor is electrically connected with the first electrode of the second transistor and the short circuit ring separately by means of the second adapter electrode.

11. The array substrate according to claim 9, further comprising a plurality of floating blocks, wherein the plurality of floating blocks are arranged at the same layer as the plurality of gate lines, and the plurality of floating blocks are approximately evenly distributed between the ground line and the plurality of gateway lines.

12. The array substrate according to claim 8, wherein the second bezel area comprises a bonding area approximately extending in the second direction on one side of the second display area far away from the first display area, and a non-rectangular area connecting the bonding area with the first bezel area; and the gateway line comprises a first gateway line segment located in the non-rectangular area, a second gateway line segment located between the bonding area and the second display area, and a third gateway line segment connecting the first gateway line segment with the second gateway line segment; and a sum of a line width of the first gateway line segment and a line distance between adjacent first gateway line segments at the same layer is a first distance, a sum of a line width of the second gateway line segment and a line distance between adjacent second gateway line segments at the same layer is a second distance, a sum of a line width of the third gateway line segment and a line distance between adjacent third gateway line segments at the same layer is a third distance, and a ratio of the first distance to the second distance is greater than 1 and smaller than or equal to 1.5.

13. The array substrate according to claim 1, wherein at least part of the gate lines are electrically connected with the anti-static structures after bending the first bezel area and the second bezel area; or the second anti-static structure extends directionally and has an acute angle with the first direction; or the second anti-static structure extends along an arc having a radian of 110°-180°.

14. The array substrate according to claim 1, further comprising a plurality of third connecting lines, wherein the plurality of third connecting lines are arranged at the same layer as the plurality of gate lines;

the second bezel area comprises a bonding area approximately extending in the second direction on one side of the second display area far away from the first display area, and a non-rectangular area connecting the bonding area with the first bezel area; and the plurality of data lines comprise first data lines and second data lines that are alternately arranged, the first data lines cross from the first display area and the second display area over the non-rectangular area and extend to the bonding area, and the second data lines cross from the first display area and the second display area over the non-rectangular area and are connected with the bonding area by means of the third connecting lines.

15. The array substrate according to claim 14, further comprising a plurality of third adapter electrodes, a first insulation layer, and a second insulation layer;

wherein a layer where the plurality of third adapter electrodes are located is on a side of a layer where the plurality of gate lines are located and a layer where the plurality of data lines are located facing away from the base substrate;

the first insulation layer is located between the layer where the plurality of gate lines are located and the layer where the plurality of data lines are located; and the second insulation layer is located between the layer where the plurality of data lines are located and the layer where the plurality of third adapter electrodes are located; and the third adapter electrode is electrically connected with the third connecting line by means of at least one first via hole penetrating the first insulation layer and the second insulation layer, and the third adapter electrode is electrically connected with the second data line by means of at least one second via hole penetrating the second insulation layer; and the at least one first via hole and the at least one second via hole corresponding to a same third adapter electrode are arranged in the first direction.

16. The array substrate according to claim 14, further comprising a plurality of fourth connecting lines and a plurality of fifth connecting lines, wherein the plurality of fourth connecting lines are located at the same layer as the plurality of gate lines, and the plurality of fifth connecting lines are located at the same layer as the plurality of data lines;

the second bezel area further comprises a wiring area connecting the bonding area with the second display area; and the plurality of data lines comprise third data lines and fourth data lines that are alternately arranged, the third data lines extend from the first display area and the second display area to the wiring area and are connected with the bonding area through the fourth connecting lines, and the fourth data lines extend from the first display area and the second display area to the wiring area and are connected with the bonding area through the fifth connecting lines.

17. The array substrate according to claim 16, further comprising a plurality of fourth adapter electrodes, a plurality of fifth adapter electrodes, a first insulation layer, and a second insulation layer, wherein the plurality of fourth adapter electrodes and the plurality of fifth adapter electrodes are arranged at a same layer, and are on a side of a layer where the plurality of gate lines are located and a layer where the plurality of data lines are located facing away from the base substrate, the first insulation layer is located between the layer where the plurality of gate lines are located and the layer where the plurality of data lines are located, and the second insulation layer is located between the layer where the plurality of data lines are located and a layer where the plurality of fourth adapter electrodes are located;

the fourth adapter electrode is electrically connected with the fourth connecting line by means of at least one third via hole penetrating the first insulation layer and the second insulation layer, and the fourth adapter electrode is electrically connected with the third data line by means of at least one fourth via hole penetrating the second insulation layer; and the at least one third via hole and the at least one fourth via hole corresponding to the same fourth adapter electrode are separately arranged in the second direction; and the fifth adapter electrode is electrically connected with the fifth connecting line by means of at least one fifth via hole penetrating the second insulation layer, and the fifth adapter electrode is electrically connected with the fourth data line by means of at least one sixth via hole penetrating the second insulation layer; and the at least one fifth via hole and the at least one sixth via hole corresponding to the same fifth adapter electrode are separately arranged in the second direction.

18. The array substrate according to claim 16, wherein the first data line comprises a first data line segment located in the non-rectangular area and a second data line segment located in the wiring area;

a sum of a line width of the first data line segment and a line distance between adjacent first data line segments is a fourth distance, a sum of a line width of the second data line segment and a line distance between adjacent second data line segments is a fifth distance, and a ratio of the fourth distance to the fifth distance is greater than 1 and smaller than or equal to 1.5.

19. The array substrate according to claim 1, wherein the first display area comprises a first sub display area arranged in contact with the second display area and a second sub display area on one side of the first sub display area far away from the second display area;

the first bezel area comprises a first sub bezel area arranged side by side with the first sub display area in the second direction and a second sub bezel area arranged side by side with the second sub display area in the second direction, and the second sub bezel area and the second sub display area have a stepped boundary line; and the first anti-static structures in the first sub bezel area are arranged side by side in the first direction, and the first anti-static structures in the second sub bezel area are arranged at steps of the stepped boundary line.

20. A display apparatus, comprising the array substrate according to claim 1 and a driver chip, wherein the driver chip is electrically connected with the plurality of gate lines and the plurality of data lines.

* * * * *